(12) United States Patent
Coon et al.

(10) Patent No.: US 6,988,060 B1
(45) Date of Patent: Jan. 17, 2006

(54) ALIGNMENT SIMULATION

(75) Inventors: Paul Derek Coon, Redwood City, CA (US); Henry Kwok Pang Chau, San Francisco, CA (US); Arun Ananth Aiyer, Fremont, CA (US)

(73) Assignee: Nikon Corporation, Tokyo (JP)

( * ) Notice: Subject to any disclaimer, the term of this patent is extended or adjusted under 35 U.S.C. 154(b) by 935 days.

(21) Appl. No.: 09/629,953

(22) Filed: Aug. 1, 2000

Related U.S. Application Data

(63) Continuation-in-part of application No. 09/071,378, filed on Apr. 30, 1998, now abandoned.

(51) Int. Cl.
G05F 17/50 (2006.01)

(52) U.S. Cl. .............................. 703/13; 355/53; 355/67; 356/400; 356/401

(58) Field of Classification Search ................ 356/400, 356/401; 703/13, 14; 355/53, 67, 55; 352/151; 430/22, 5; 438/692, 401; 250/559.24; 359/561; 451/6; 257/797
See application file for complete search history.

(56) References Cited

U.S. PATENT DOCUMENTS

| | | | | |
|---|---|---|---|---|
| 4,860,374 A | * | 8/1989 | Murakami et al. | 385/151 |
| 5,446,542 A | * | 8/1995 | Muraoka | 356/400 |
| 5,468,580 A | * | 11/1995 | Tanaka | 430/22 |
| 5,481,362 A | * | 1/1996 | Van Den Brink et al. | 356/401 |
| 5,493,402 A | * | 2/1996 | Hirukawa | 356/400 |
| 5,754,300 A | * | 5/1998 | Magome et al. | 356/401 |
| 5,786,116 A | * | 7/1998 | Rolfson | 430/5 |
| 5,822,043 A | * | 10/1998 | Ebinuma | 355/53 |
| 5,852,497 A | * | 12/1998 | Pramanik et al. | 356/401 |
| 5,898,478 A | * | 4/1999 | Yim et al. | 355/53 |
| 5,920,430 A | * | 7/1999 | Grycewicz | 359/561 |
| 5,922,619 A | * | 7/1999 | Larkin | 438/692 |
| 5,929,978 A | * | 7/1999 | Masaki | 355/53 |
| 5,994,006 A | * | 11/1999 | Nishi | 430/22 |

(Continued)

Primary Examiner—Kevin J. Teska
Assistant Examiner—Kandasamy Thangavelu
(74) Attorney, Agent, or Firm—Finnegan, Henderson, Farabow, Garrett, & Dunner, L.L.P.

(57) ABSTRACT

An alignment simulation method simulates the signal waveform for an alignment mark using various alignment methods as well as the signal strength for an alignment mark, which is useful in optimizing the thickness of one or more layers as well as the geometry of the mark. The simulation of signal strength is also useful in optimizing the thickness of a layer for artifact wafers. The alignment simulation method includes accurately modeling the alignment mark, including one or more layers of various thicknesses and materials. The accurate modeling of the alignment mark includes such things as smoothing regions of the alignment mark and generating lateral shifts of the layers. The model of the alignment mark is a series of small pixels, each including the thickness of the layers and the layers indices of refraction. Using scalar diffraction, a complex reflectivity is generated for each pixel and a fast fourier transform is performed on the series of pixels. The results of the fast fourier transform are used to simulate the diffraction intensities for the alignment mark alignment systems, such as LIA or LSA as well as the signal waveforms. The LSA signal waveform, however, requires additional modeling of the alignment mark. An FIA image is generated by removing appropriate orders from the fast fourier transform result and performing an inverse fast fourier transform and repeating the process at different light wavelengths and illumination angles. The signal strength is the maximum value of the image minus the minimum.

41 Claims, 14 Drawing Sheets

U.S. PATENT DOCUMENTS

| | | | |
|---|---|---|---|
| 6,034,378 A * | 3/2000 | Shiraishi | 250/559.29 |
| 6,091,481 A * | 7/2000 | Mori | 355/67 |
| 6,102,775 A * | 8/2000 | Ushio et al. | 451/6 |
| 6,297,876 B1 * | 10/2001 | Bornebroek | 355/67 |
| 6,376,329 B1 * | 4/2002 | Sogard et al. | 438/401 |
| 6,501,188 B1 * | 12/2002 | Stanton et al. | 257/797 |

* cited by examiner

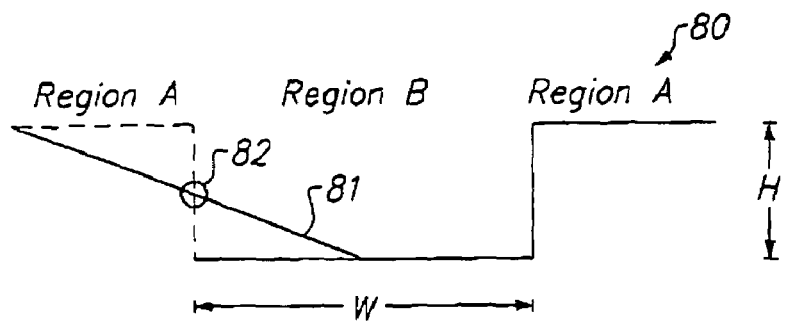
FIG. 8A
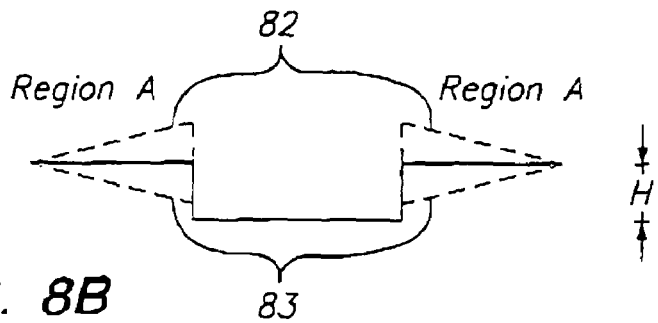
FIG. 8B
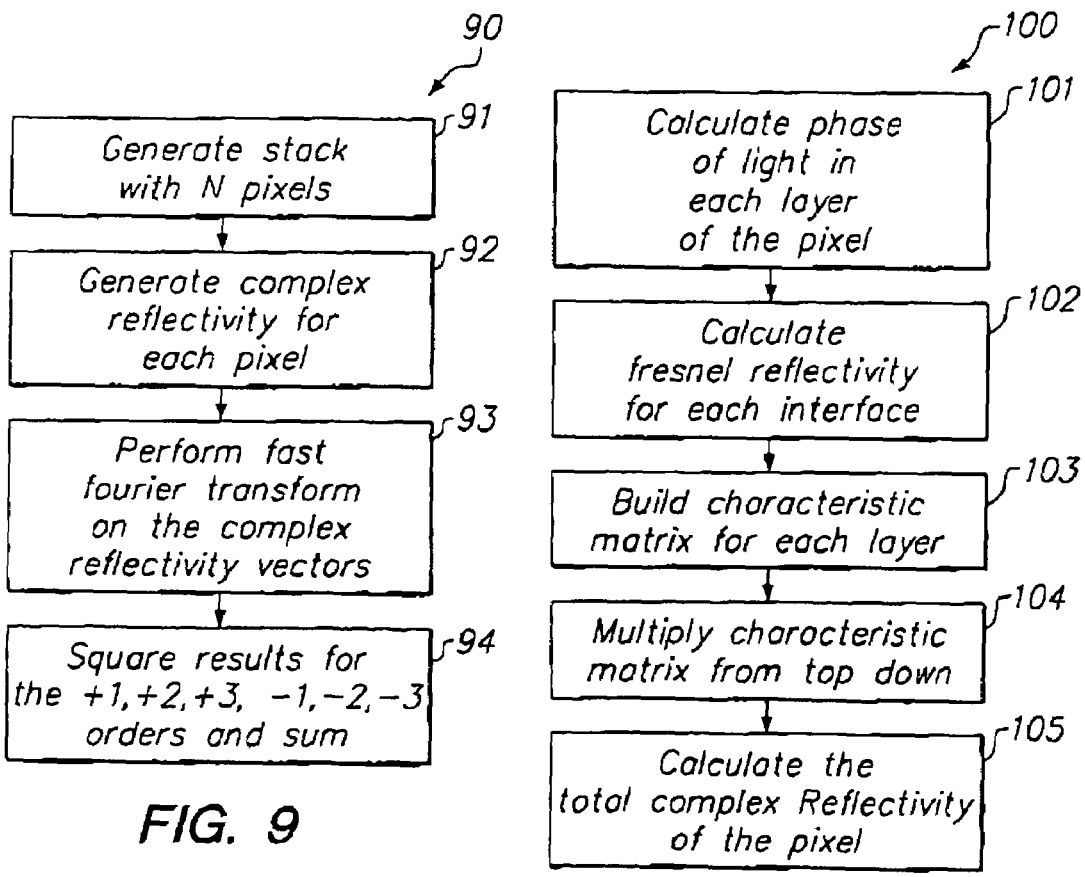
FIG. 9
FIG. 10

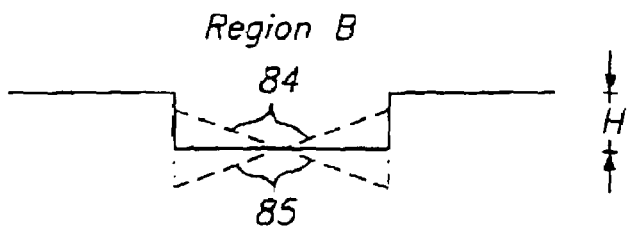
FIG. 8C
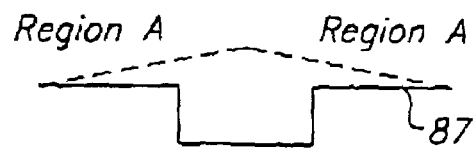
FIG. 8E
FIG. 8D
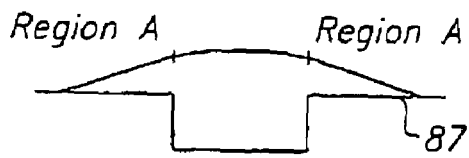
FIG. 8F
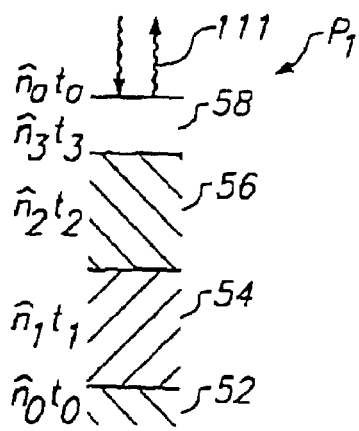
FIG. 11
FIG. 8G

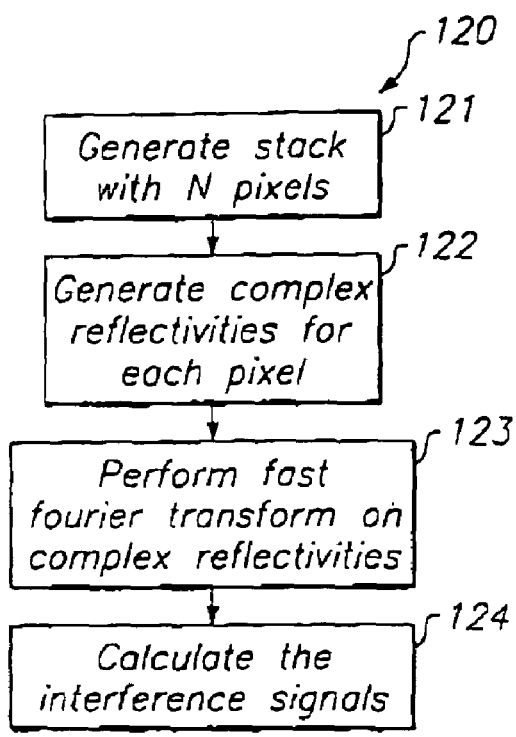
FIG. 12
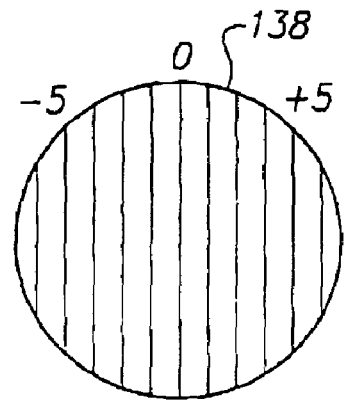
FIG. 14
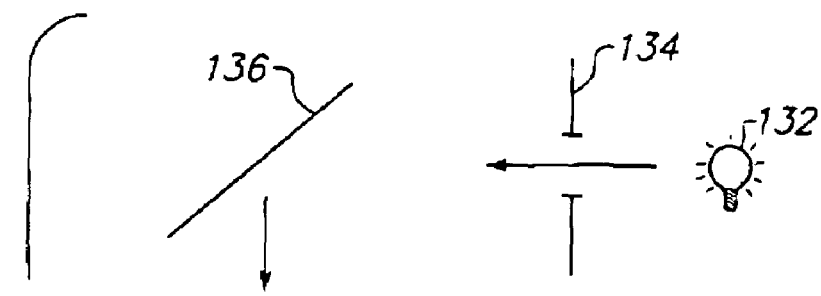
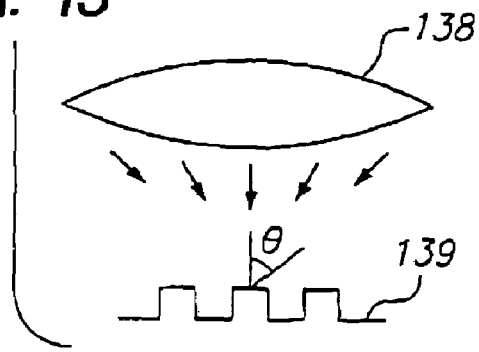
FIG. 13

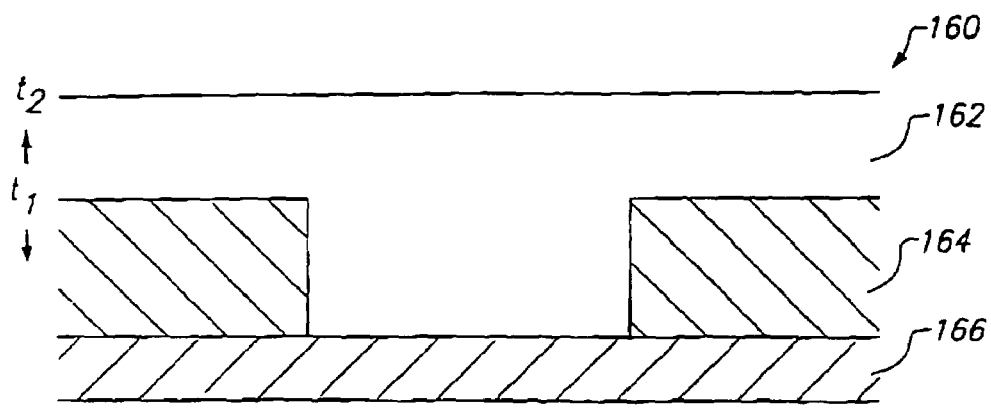
FIG. 16
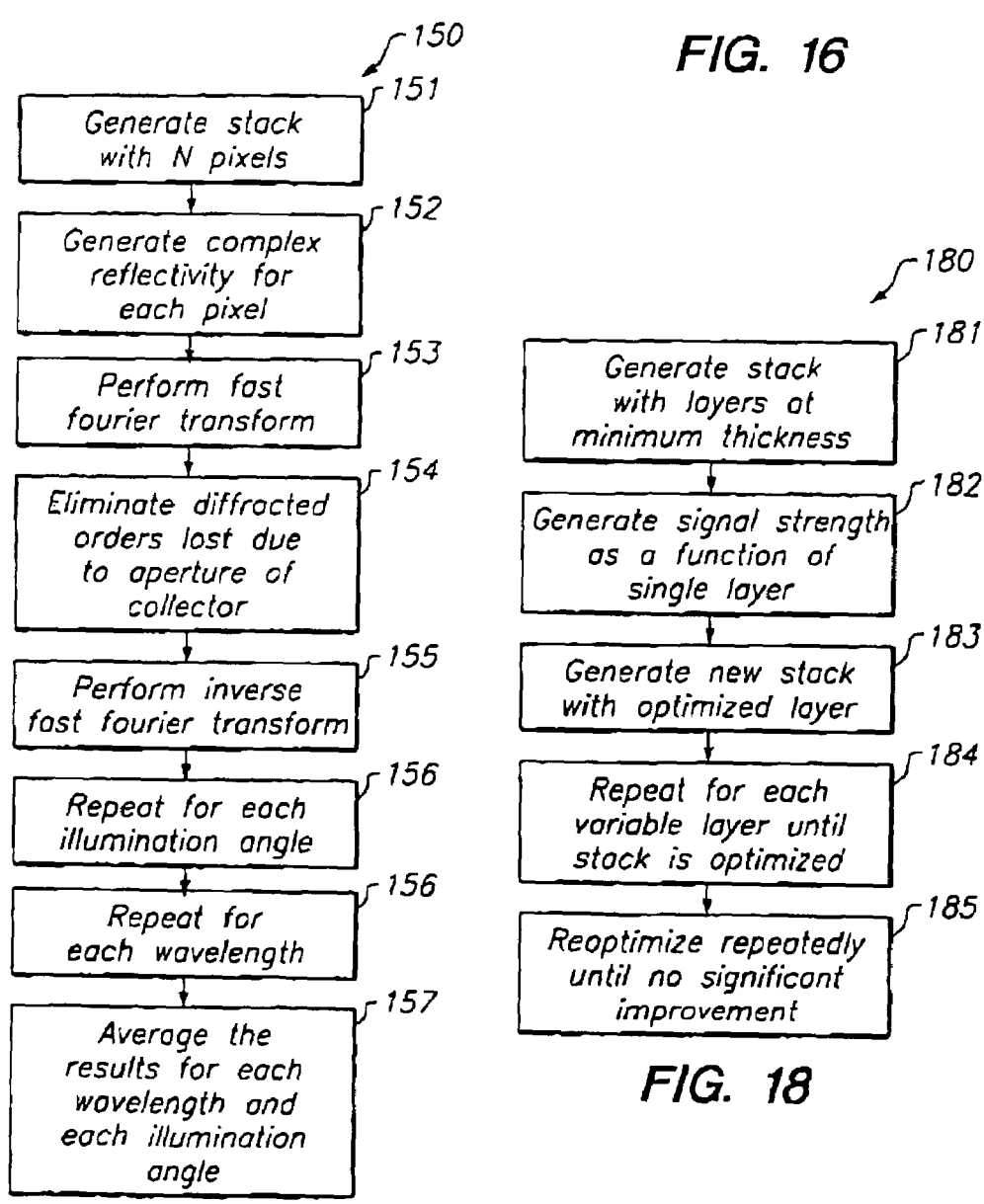
FIG. 15
FIG. 18

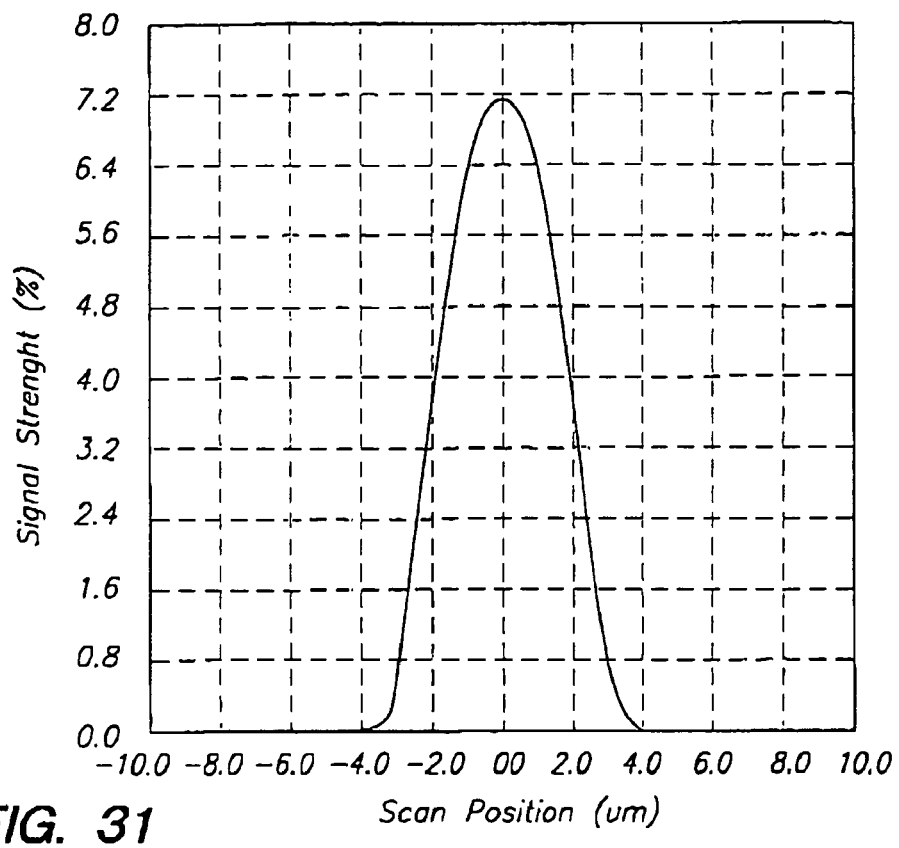
FIG. 31
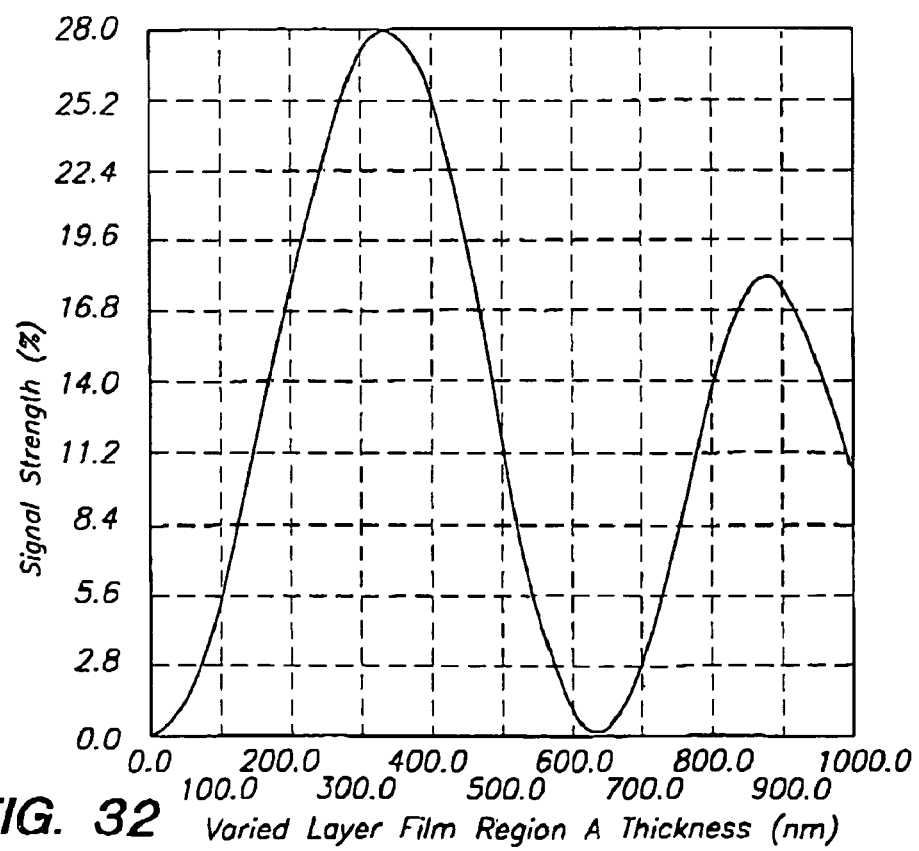
FIG. 32  Varied Layer Film Region A Thickness (nm)

ALIGNMENT SIMULATION

This application is a continuation-in-part of U.S. Ser. No. 09/071,378 filed Apr. 30, 1998, now abandoned. The content of this application is incorporated herein by reference.

FIELD OF THE INVENTION

The present invention relates to precision alignment marks used in semiconductor integrated circuit manufacturing, and in particular to the simulation of signals generated by such marks.

BACKGROUND

The use of alignment marks to properly align masks used for making a semiconductor integrated circuit during processing is well known. Alignment marks are typically depressions or high spots on the wafer surface, for example in an overlying layer, such as oxide. Often the alignment marks are covered by subsequent overlying layers. The production of alignment marks on a wafer is typically an involved process involving the exposure and etching of the alignment mark pattern in a layer overlying the silicon substrate. During the subsequent processing of the wafer, the alignment mark is typically covered with additional process layers. To align the wafer, the wafer stepper scans light, such as from a laser, on the wafer and detects any diffraction patterns generated by the underlying alignment mark. The diffraction patterns are converted into electrical signals that are analyzed by the wafer stepper, which then aligns the wafer accordingly.

There are several commonly used alignment marks types and methods for detecting the marks, including: Laser Step Alignment ("LSA"), Field Image Alignment ("FIA"), Laser Interferometric Alignment ("LIA"), and Wafer Global Alignment ("WGA"), all of which were developed by Nikon Corp. Additional alignment systems are for example, the Axiom System by Silicon Valley Group Lithography, and the system used with the Canon 6 Bar.

The diffraction patterns generated by the underlying alignment marks are a function of the size and shape of the alignment mark as well as the material and thickness of the alignment mark and any overlying layers. To improve the accuracy of the alignment system, it is desirable to optimize the diffraction patterns generated by the underlying alignment mark. To optimize a diffraction pattern produced by a specific alignment mark it is necessary to appropriately adjust the thickness and geometry of the layers.

Currently, optimization of size, shape, and depth of alignment marks is performed by physically producing the actual alignment mark on a test wafer and testing the alignment mark to determine the strength of its resulting signal. Several variations of the mark may be produced and tested on a single test wafer. For example, variations of the size or geometry of the mark may be produced on one wafer. Variations of the thicknesses of the various layers, however, are produced on separate wafers. The alignment mark with the strongest signal is then chosen as the optimized alignment mark. The actual production of alignment marks for testing, however, is expensive and involves a significant amount of valuable time on the wafer steppers, thereby reducing yield produced by the wafer steppers.

Thus, there presently is a need for a method of testing and optimizing an alignment mark without requiring the actual manufacture and testing of the mark.

SUMMARY

An alignment simulation method is used to simulate the signal waveforms and signal strengths for an alignment mark in various alignment methods. The alignment simulation method may be embodied in a computer program and executed by a microprocessor or microcontroller. The computer program is stored in a computer readable memory associated with the microprocessor/microcontroller.

There are currently no known alignment simulation programs that quickly generate signal waveforms and signal strengths of alignment marks for different alignment methods. Consequently, the testing and optimization of alignment marks is currently conducted empirically and experimentally, requiring valuable stepper time. The alignment simulation method in accordance with an embodiment of the present invention, however, permits fast generation of signal waveforms and signal strengths. Thus, the present alignment simulation method permits optimization of one or more layer thicknesses as well as mark geometry without requiring actual manufacture of a test alignment mark. Further, the present alignment simulation method can be used to optimize artifact wafers by optimizing a layer thickness to produce equal signal strengths for two separate alignment marks on different layers.

The present alignment method includes generating an accurate model or "stack" of a cross section of the alignment mark. The stack is formed with a series of small columns or "pixels" where each pixel includes data on the thicknesses of the physical layers in the pixel as well as the complex indices of refraction associated with the layers. In order to generate an accurate stack, the layers can be independently smoothed at different locations as well as laterally shifted. Smoothing is performed by providing a slope to the region to be smoothed and then averaging the height of the pixels using a gaussian distribution.

Once an accurate stack representing the alignment mark is generated, a complex reflectivity is generated for each pixel in the stack. A fast fourier transform is then performed on the series of pixels in the stack. With the result of the fast fourier transform the diffraction intensities may be generated for different alignment methods such as LSA and LIA. Moreover, the signal waveforms may then be generated for the alignment methods. However, because the LSA method is a dynamic sensing method, further modeling of the alignment mark is necessary.

The FIA system is a broad band imaging system, which uses multiple wavelengths of light at multiple illumination angles. The FIA image may be simulated by generating a complex reflectivity for each pixel for various wavelengths and various illumination angles. A fast fourier transform is then performed. Because the numerical aperture of the collector in an FIA system is of limited size, certain orders of the fast fourier transform result will be lost. Thus, these orders are removed. An inverse fast fourier transform is then performed on the remaining orders of the fast fourier transform result, thereby generating images at the different wavelengths and illumination-angles. These images can then be averaged together to generate the final image. The signal strength or "contrast" of the FIA signal may then be generated by taking the peak to peak signal, or subtracting the minimum value of the image from the maximum value.

The thickness of a layer in the alignment mark may be optimized by generating the signal strength in for the alignment mark for different thicknesses of the layer. By comparing the signal strengths at the different thicknesses, the optimized thickness may be found.

This method may be used to optimize the thickness for an artifact wafer where there are two marks in two different layers. The thickness of the layer is optimized where both marks produce signals of the same intensity.

Multiple layers may also be optimized by optimizing one layer at a time. Once every variable layer has been optimized, the process is repeated until there is no significant change in the results. Further, after the first optimization of a layer, the optimized thickness is approximately known. Thus, for subsequent optimizations of that layer, the signal strengths can be generated for a reduced range of thicknesses for that variable layer. Thus, the accuracy of the optimization is improved.

BRIEF DESCRIPTION OF THE DRAWINGS

The above and other features, aspects, and advantages of the present invention will become better understood with regard to the following description, appended claims, and accompanying figures, where:

FIG. 8A is a cross sectional view of a single layer mark of width W and height H and having one sloping sidewall;

FIGS. 8B and 8C show a mark with respective regions A and B sloped both upward and downward;

FIGS. 8D through 8G show the generation of an up smoothed region A on an alignment mark;

FIG. 9 is a flow chart of the process of simulating the signal intensity for an alignment mark using a LSA sensor;

FIG. 10 is a flow chart of the calculation of the complex reflectivity for an individual pixel;

FIG. 11 shows a single pixel having an associated complex index of refraction and a thickness for each layer along with incident light;

FIG. 12 is a flow chart of a process of simulating the signal intensity for an alignment mark using a LIA sensor;

FIG. 13 shows a simplified view of an FIA illumination system;

FIG. 14 shows eleven equally spaced illumination angles across an illumination aperture used in the FIA illumination system of FIG. 13;

FIG. 15 is a flow chart of a process of simulating the signal waveform for an alignment mark using a FIA sensor;

FIG. 16 is a simple two layer stack where one of the layers has a variable thickness;

FIG. 18 is a flow chart of the process of simulating the signal strength of an alignment mark as a function of thickness of multiple layers;

FIG. 31 is a graph showing an example of a LSA signal waveform; and

FIG. 32 is a graph showing a LSA signal strength simulation as a function of a layer thickness.

DETAILED DESCRIPTION

Figure 1:
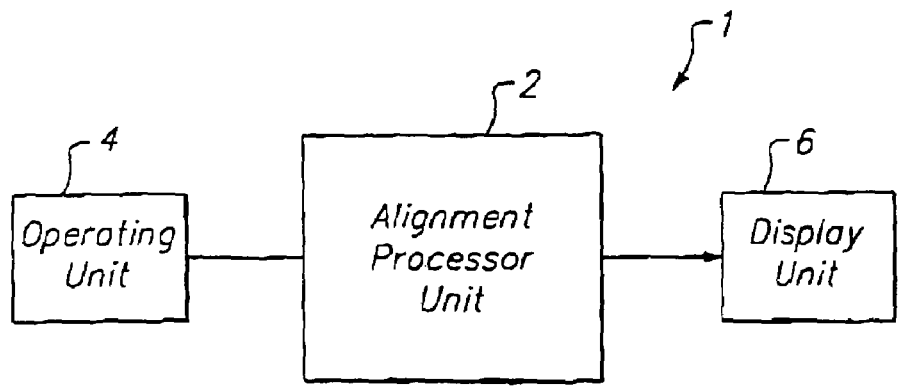
FIG. 1 shows a block diagram of an alignment simulator with an alignment processor unit, an operating input for inputting various instructions and parameters into the alignment processor unit, and a display unit for displaying the results of the alignment simulation.

FIG. 1 shows an alignment simulator 1, including an alignment process unit 2, an operating input unit 4 for inputting various instructions and parameters into the alignment processor unit 2, and a display unit 6 for displaying the results of the alignment simulation.

The operating input unit 4 can be any conventional user interface device such as a mouse, keyboard, or voice activation and is used to instruct the alignment processor unit 2. For example, using operating input unit 4, the user can input into the alignment processor unit 2 the type of alignment method, the size and shape of the alignment mark, as well as the types of materials and thicknesses of the layers. Further, operating input unit 4 can be used to instruct the alignment processor unit 2 on the type of simulation mode, i.e., predicting the signal waveform or determining the optimum alignment parameters.

The display unit 6 displays the results of the alignment simulation in graphical or numerical representation. Display unit 6 can be either a screen display or a printer, and of course can be both.

Using the methods that will be described in detail below, alignment processor unit 2 can perform several basic alignment simulations, including: (1) simulating the signal strength of the alignment mark as a function of position, i.e., producing the alignment signal waveform; (2) simulating the peak signal strength as a function of changes in a single layer's thickness and alignment mark geometry; (3) simulating the peak signal strength as a function of independent changes in two layer's thickness and alignment mark geometry; (4) determining the optimum layer thickness of any number of layer parameters or mark geometries in order to provide the peak signal strength; and (5) determining the optimum layer thickness so that two dissimilar alignment marks have the same peak signal strength. It will be understood by those of ordinary skill in the art that this list is not exhaustive, but that additional modes are possible in light of the present disclosure.

Alignment processor unit 2 typically includes a microprocessor, or microcontroller executing a computer program (instructions) stored in a computer readable memory (medium) associated with the microprocessor/microcontroller. The alignment simulation process embodied in such a computer program is described in further detail below; coding such a program is well within the skill of one of ordinary skill in the art in light of the present disclosure using the "C" computer language.

Building a Stack

Figure 2:
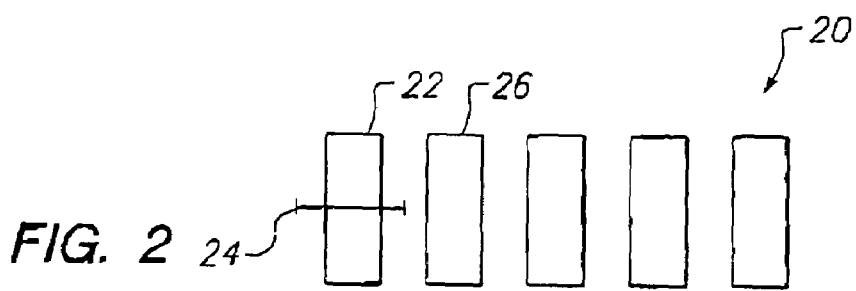
FIG. 2 shows a plan view of an example of alignment marks.
Figure 3:
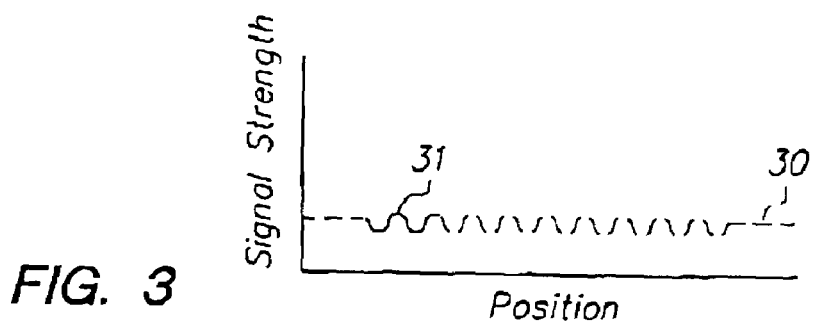
FIG. 3 is an example of an LIA waveform signal generated by the alignment marks shown in FIG. 2.

To simulate the signals generated by an alignment mark, an accurate model or representation of the mark must first be generated. FIG. 2 shows a plan view of an example of alignment marks 20. Typically, an alignment mark is comprised of several marks spaced slightly apart from one another. The alignment signal generated by alignment mark 20 using for example the FIA method, is shown in FIG. 3 as waveform 30, where solid line 31 represents the waveform for a single mark 22, shown in FIG. 2. As can be seen in FIG. 3, the alignment signal generated for each individual mark in alignment mark 20 is very similar. Accordingly, only single mark 22 needs to be simulated to accurately simulate the waveform for the entire alignment mark 20. A model of alignment mark 22 can be generated based on a cross section of the mark at bar 24. As shown in FIG. 2, bar 24 extends from one side of mark 22 to half way between mark 22 and mark 26, thereby assuring that no data relevant to alignment mark 20 is lost.

Figure 4:
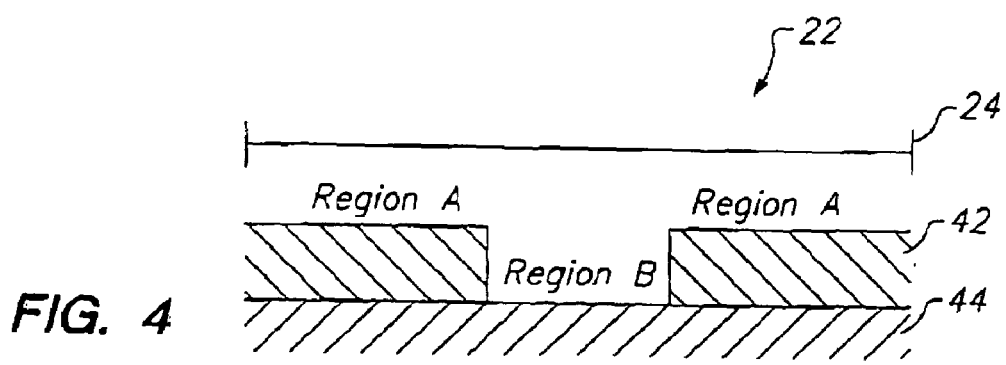
FIG. 4 is a cross sectional view of a single alignment mark.

FIG. 4 is a cross sectional view of an actual (physical) alignment mark 22. Alignment mark 22 is a simple example of a single layer alignment mark. Alignment mark 22, for example, is a mark in an oxide layer 42 on a silicon substrate 44. As shown in FIG. 4, alignment mark 22 includes three regions; regions A at the outside of the mark and region B.

Figure 5:
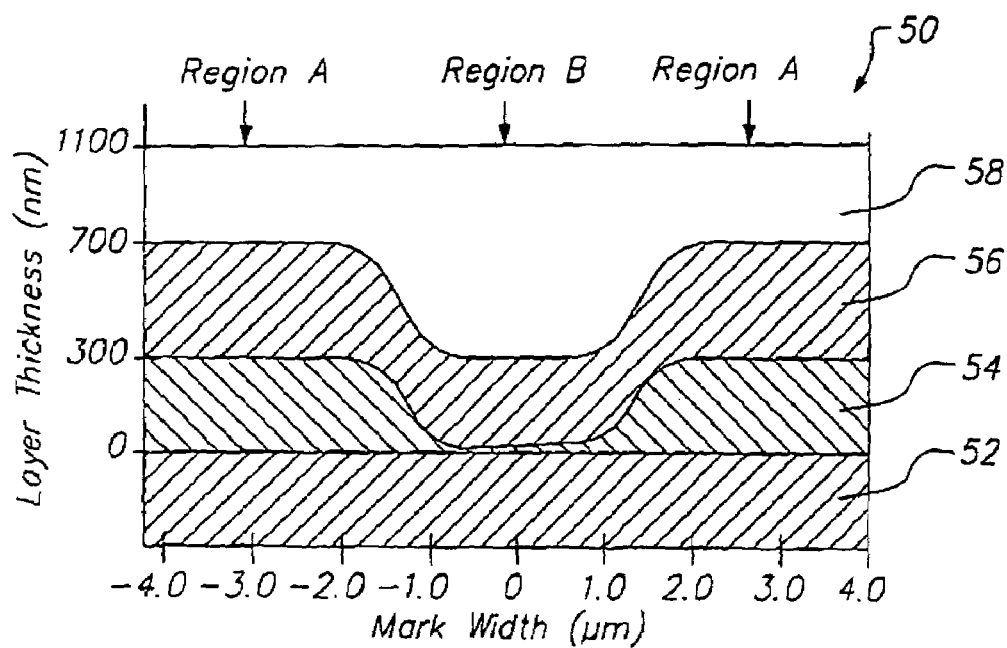
FIG. 5 is a diagram of a stack representing several layers overlying a substrate.

A mathematical model or "stack" of the cross section of the alignment mark is generated from data relating to such factors as the width of the mark, the material and thickness of each layer and whether the layer is planar or conformal. FIG. 5 is a diagram of a stack 50 where the X axis represents the mark width in $\mu$m (micrometers) and the Y axis represents the layer thickness in nm (nanometers). By way of an example stack 50 represents a silicon substrate 52 covered by an etched oxide layer 54 forming the alignment mark. A conformal polysilicon layer 56 overlies the oxide layer 54, such that the polysilicon layer 56 fills in region B. A planar resist layer 58 overlies layer 56 and above planar resist layer 58 is air. The complex index of refraction and the thickness of each layer is generated in conformity to the data provided. It should be understood that the specific layers shown in FIG. 5 are exemplary and that any number of layers may be used in stack 50. Moreover, different thicknesses and types of material may be used for each layer than those illustrated.

While stack 50 is shown as a "negative" mark, i.e., the outside of the mark is higher than the center, it should be understood that a "positive" mark may be similarly modeled.

Figure 6:
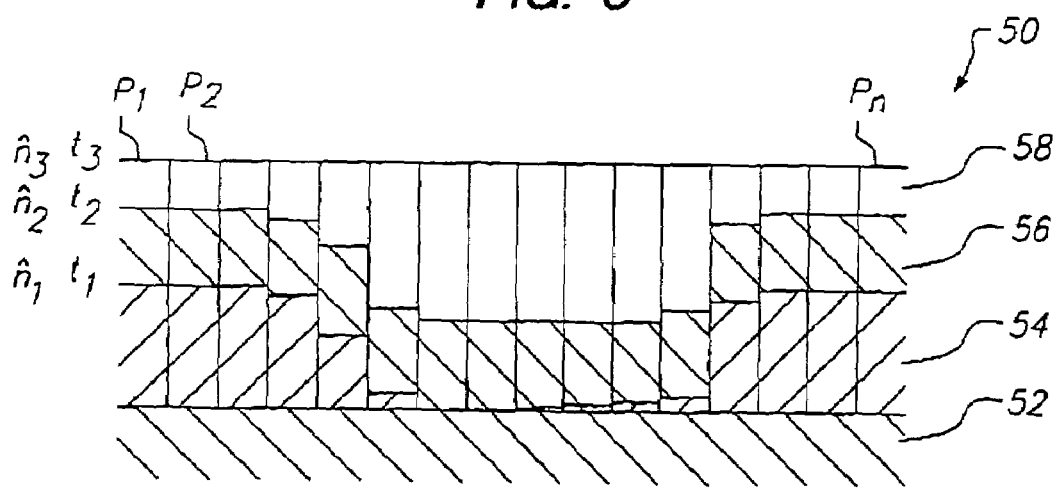
FIG. 6 is a diagram of a stack showing individual pixels, where each pixel is composed of a number of layers each having a thickness and an associated complex index of refraction.

Stack 50 is actually generated as 256 discrete columns or pixels, where each pixel is composed of one or more layers having a thickness and a complex index of refraction associated with the materials used for the layers. While 256 pixels are used, any desired number of pixels may be used. Typically, an alignment mark has a pitch of 8 $\mu$m (micrometers) and therefore each pixel is 31.25 nm (nanometers) in width. FIG. 6 shows stack 50 divided into a number of pixels $P_1$ through $P_N$. Each pixel in stack 50 is composed of a number of layers each having a thickness $t_1$ to $t_3$ and an associated complex index of refraction $\hat{n}_1$ to $\hat{n}_3$.

In order to accurately model an actual alignment mark, considerations such as corner rounding or "smoothing," sloping of region B, and the lateral shift of specific layers must be specified. Thus, as illustrated by stack 50 in FIG. 5, the edges of the mark are smoothed so that there is corner rounding. Further, because alignment marks may be asymmetrical it is necessary to specify the amount of slope or curvature desired for each side of the mark. As shown in FIG. 5, stack 50 is asymmetrical with a greater slope on the left side wall. Stack 50 also illustrates lateral shift of layer 56 towards the left. Lateral shift is implemented by simply offsetting the layer by the desired amount. In addition, oxide layer 54 is shown as sloping in region B. The slope of region B is implemented by providing the desired slope to that area.

Figure 7:
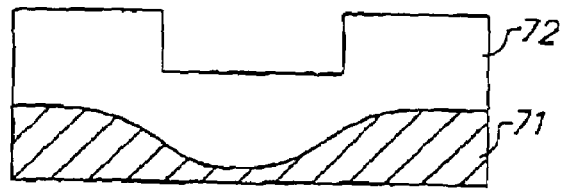
FIG. 7 is a cross sectional view of an alignment mark showing a smoothed layer covered by a non-smoothed layer.

Each layer of stack 50 may be smoothed independently, thus, it is possible for an underlying layer to be smoothed while an overlying layer is not. If a layer does not have smoothing, the top surface for each pixel is drawn so that it has a height that is equal to the specified thickness for that layer at region A or region B plus the thickness for the preceding layers at the edge of region A and the center for region B as shown in FIG. 7. Thus, as shown in FIG. 7, the lower layer 71 is smoothed, while the upper layer 72 is not. Consequently, the thickness for a particular layer in a pixel is equal to the height of the pixel minus the height of the preceding layers.

If a layer is to be smoothed, the above process is followed and then the steps of providing a slope to the sidewall and averaging are performed. The first step is to vary the slope of the sidewalls, which may be smoothed independently. Where there is to be no smoothing, the sidewall slope is ninety degrees. Thus, the minimum slope, which is associated with zero smoothing, is defined as a slope of ninety degrees. The maximum slope is therefore defined as the greatest slope possible away from ninety degrees.

FIG. 8A shows an example of a layer 80 with a mark of width W and height H and with a sloping left sidewall 81. As shown in FIG. 8A, the right sidewall of layer 80 has zero smoothing and therefore has the minimum slope, i.e., ninety degrees. The left sidewall however has the maximum slope possible, i.e., the sidewall extends to the edge of region A. The width W of the mark is defined as the width at the half of the height H. Thus, regardless of the slope specified, the sloping sidewall passes through the intersection point 82. The dotted line is for illustrative purposes showing how the intersection point 81 is determined.

The next step is to average the left and right sides of the mark independently. First the averaging window size is determined. As shown in FIG. 8A, the averaging window for the right sidewall would be one pixel, because that sidewall has no slope. Because the left sidewall has the maximum slope it would have an averaging window equal to half the pixels or 128 pixels if 256 total pixels are used. However, an odd number of pixels are used in accordance with the Savitsky-Golay method and thus, the averaging window is 127. By using an odd number of pixels, symmetry may be preserved as there will be an equal number pixels on the left and right of the center pixel in the stack. A gaussian distribution is then created for the averaging window size using the following equation:

$$\text{average}(i) = \exp\left(-0.001 \times \left(i - \left(\frac{\text{window size} - 1}{2} + 1\right)\right)^2\right) \quad \text{equ. 1}$$

where i signifies the number of the pixel. The total for the average value for each pixel is then calculated. To smooth the slope, each pixel of the sloped data is averaged by its neighbor and the total is divided out. Thus, the abrupt changes of the sloped sidewall are smoothed away. Of course, there are other methods of smoothing the sidewalls that may be used as will be known by those of ordinary skill in the art.

In addition, the smoothing may be limited to a particular region, such as region A or region B, which allows these regions to be smoothed independently of the rest of the mark. Moreover, each region can be smoothed up or down. This is useful in modeling a mark made with chemical mechanical polish processing. When smoothing region A or B, the sidewall remains vertical and the two step procedure of sloping and averaging is followed. FIG. 8B shows a mark of height H where region A is sloped up (dotted lines 82) and sloped down (dotted lines 83). FIG. 8C shows a mark of height H where region B is sloped up (dotted lines 84) and sloped down (dotted lines 85). As can be seen in FIGS. 8B and 8C, the minimum slope possible is no slope, while the maximum slope possible is determined by the height H of the mark. In the next step, the sloped line is averaged using the gaussian distribution of equ. 1 as described above.

During the sloping procedure, two marks are actually generated; one mark 86 with no slope and one mark with the desired slope 87 as shown in FIGS. 8D and 8E, respectively. FIG. 8E shows mark 87 with an upward sloping region A. The slope of mark 87 is then averaged as described in reference to equ. 1, thereby generating a curved region A as shown in FIG. 8F. The appropriate regions of mark 87 from FIG. 8F and mark 86 from FIG. 8D are then combined, i.e., regions B and A respectively, to generate the combined mark 88 with a smoothed up region A shown in FIG. 8G.

Of course other methods of generating an accurate stack can be utilized. For example, the stack can be generated by scanning into alignment simulator 1 a scaled representation of the cross section of the alignment mark and converting the scanned representation into a stack including pixels as described above. The complex indices of refraction may be added separately.

Simulating Signal Strength or Intensity

The signal strength or intensity for an alignment mark configuration is calculated slightly differently for each type of sensor, i.e., LSA, LIA, and FIA. The LSA and LIA systems measure diffracted light, while the FIA system is an imaging system. For more information relating to the use of Fourier Optics to calculate diffraction intensity see "Fourier Optics: An Introduction," by E. G. Steward, Ellis Horwood Limited Publishers, Chichester, England (1987), which is incorporated herein by reference.

1. Laser Step Alignment ("LSA")

FIG. 9 is a flow chart 90 of the process of simulating the signal intensity for an actual alignment mark using a LSA sensor. The alignment mark must first be modeled by generating a stack with a number N of pixels as described in reference to FIGS. 2 through 8 (step 91). Once an accurate stack is generated, the complex reflectivity for each individual pixel is calculated (Step 92).

FIG. 10 is a flow chart 100 of the calculation of the complex reflectivity for an individual pixel. First the phase ($\phi$) of the light in each layer of the pixel is calculated (Step 101). FIG. 11 shows single pixel $P_1$ from stack 50 (shown in FIG. 6) along with incident light 111. Single pixel $P_1$ includes layers 54–58 on substrate 52, each having an associated complex index of refraction ($\hat{n}_x$) for the specific layer material as well as a thickness ($t_x$). The phase $\phi_x$ of light for layer x may be written as:

$$\phi_x = \frac{2\Pi \hat{n}_x t_x}{\lambda} \quad \text{equ. 2}$$

where $\lambda$ is the wavelength of light. In the LSA system, typically an He—Ne laser light source is used and therefore the wavelength is 632.8 nm.

Once the phase of the light in each layer is calculated, the Fresnel reflectivity ($\hat{r}_x$) is calculated for each interface, including the interface between the air and layer 58 as well as the interface between layer 54 and substrate 52 (Step 102). The Fresnel reflectivity for each interface is the following $$\hat{r}_x = \frac{\hat{n}_{x+1} - \hat{n}_x}{\hat{n}_{x+1} + \hat{n}_x} \quad \text{equ. 3}$$

Next, a characteristic matrix ($\overline{C}_x$) for each layer is generated (Step 103). The characteristic matrix has the form of:

$$\overline{C}_x = \begin{bmatrix} e^{i\phi_x} & \hat{r}_x e^{i\phi_x} \\ \hat{r}_x e^{-i\phi_x} & e^{-i\phi_x} \end{bmatrix} \quad \text{equ. 4}$$

where $\phi_x$ is the phase of light in layer x, and $\hat{r}_x$ is the Fresnel reflectivity at layer x.

The characteristic matrices are then multiplied from the top layer down (Step 104) accordingly.

$$\overline{C}_{Total} = \begin{bmatrix} a & b \\ c & d \end{bmatrix} = \overline{C}_a \times \overline{C}_3 \times \overline{C}_2 \times \overline{C}_1 \times \overline{C}_0 \quad \text{equ. 5}$$

The total complex reflectivity for the pixel is then calculated according to the following (Step 105):

$$\hat{R} = \frac{\overline{C}_{Total}(c)}{\overline{C}_{Total}(a)} \quad \text{equ. 6}$$

Where $\overline{C}_{total}(c)$ is the number in the second row first column of the resultant characteristic matrix shown in equ. 5 and $\overline{C}_{total}(a)$ is the number in the first row first column. This process is performed for each pixel until a complex reflectivity is calculated for all the pixels of the stack (Step 92 of FIG. 9), i.e., $R_1, R_2, \ldots R_N$. For more information of the calculation of the complex reflectivities, see "Optical Properties of Thin Solid Films," by O. S. Heavens, Dover Publications, Inc., New York (1991), which is incorporated herein by reference.

Once the complex reflectivity has been calculated for all the pixels of the stack, a fast fourier transform (fft) is performed on the complex reflectivity (Step 93, shown in FIG. 9). Performing a fft on a set of data points is well within the knowledge of those of ordinary skill in the art. For more details in ffts see "Numerical Recipes in C, Second Edition," by Press, Teukolsky, Vettering and Flannery, pp. 537–606, Cambridge University Press, New York (1992), which is herein incorporated by reference.

The resulting +1, +2, +3, −1, −2, and −3 orders are then multiplied by their respective complex conjugates, which gives the intensity for each order. The intensity results are then summed together resulting in the total diffracted energy for the LSA system (Step 94). FIG. 32 shows a graph 32 showing an example of a LSA signal intensity plot as a function of layer thickness.

2. Laser Interferometric Alignment ("LIA")

The LIA system measures diffracted energy similar to the LSA system. However, the LIA system uses two laser beams with slightly different frequencies and measures the interference signal of the resultant diffracted beams.

FIG. 12 is a flow chart 120 of a process of stimulating the signal intensity for an alignment mark using a LIA sensor. As with the LSA process in FIG. 9, first a stack with N pixels must be generated that accurately represents the alignment mark (Step 121). The complex reflectivity for each pixel in the stack is then generated as described in reference to FIG. 10. Although the LIA system uses two laser beams with differing frequencies, the difference in frequencies is so slight that a single complex reflectivity may be generated for both the primary and secondary beam (Step 122). In a LIA system, there is only one laser used, but the beam is split into two beams and one of the beams has its frequency shifted by an Acousto Optic Modulator. A He—Ne laser of wavelength 632.8 nm is used, which has a frequency of 4.741e14 Hz, while the difference between the two beams is typically 25 kHz. This difference is insignificant for calculating the complex reflectivities.

Once the complex reflectivities are generated for each pixel, a fft is performed on the complex reflectivities (Step 123) similar to that described in reference to the LSA system in FIG. 9.

There are three interference signals that are measured in an LIA system. Specifically, the +1 and −1 order interference, 0 and +2 order interference, and 0 and −2 order interference are measured. The following three equations are then used to calculate the three different interference signals from the results of the fft from Step 123:

$$\frac{+1}{-1} \text{ intensity} = 4 \times \sqrt{|fft(+1)|^2 \times |fft(-1)|^2} \qquad \text{equ. 7}$$

$$\frac{0}{+2} \text{ intensity} = 4 \times \sqrt{|fft(0)|^2 \times |fft(+2)|^2}$$

$$\frac{0}{-2} \text{ intensity} = 4 \times \sqrt{|fft(0)|^2 \times |fft(-2)|^2}$$

where +1/−1 intensity represents the diffraction intensity of the interference between the +1 and −1 orders, the 0/+2 intensity represents the diffraction intensity of the interference between the 0 and +2 orders, the 0/−2 intensity represents the diffraction intensity of the interference between the 0 and −2 orders, and where $|fft(x)|^2$ represent the fft result of the x order multiplied by its complex conjugate (Step 124).

Figure 27:
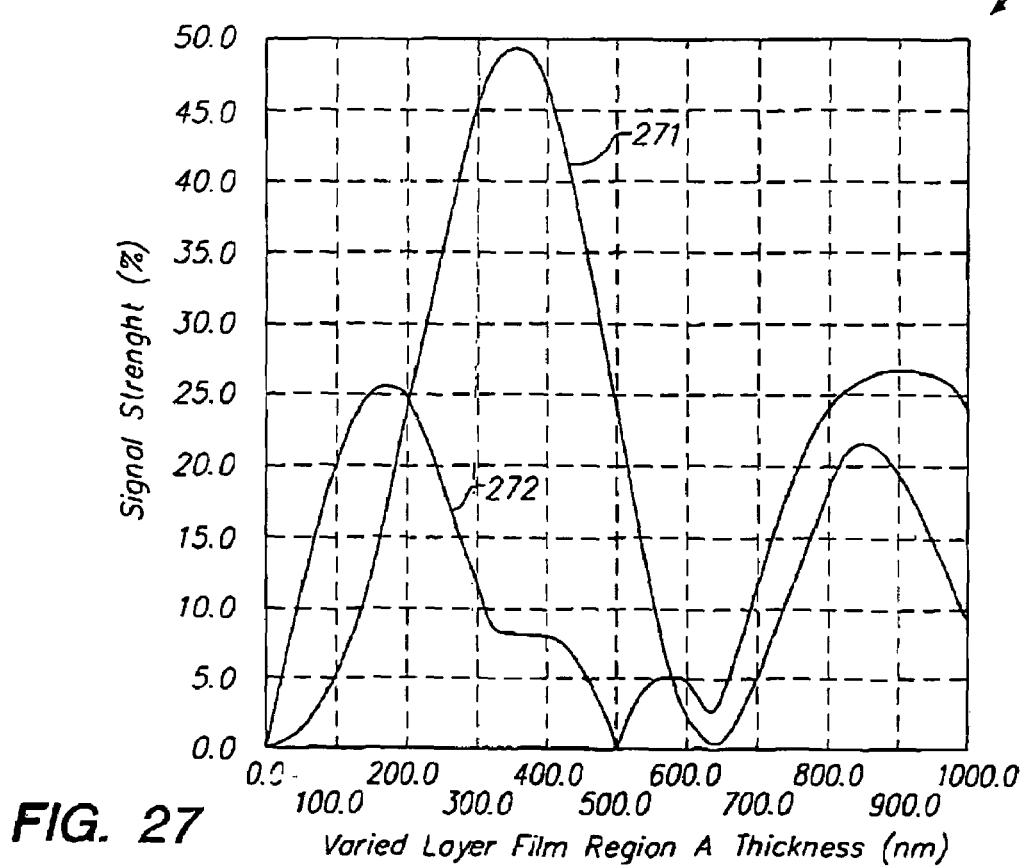
FIG. 27 is a graph showing a LIA signal strength simulation as a function of layer thickness.

An example of a single laser LIA signal strength waveform as a function of a single layer thickness is shown in FIG. 27 is graph 270. Although only two waveforms are shown in graph 270 there are actually three, but the 0/+2 order and 0/−2 order overlap. Thus, waveform 271 represents the +1/−1 order and waveform 272 represents both the 0/+2 order and the 0/−2 order.

3. Field Image Alignment ("FIA")

The FIA system is a broad band (multiple wavelength) imaging system. Thus, light of multiple wavelengths are impinging on the alignment mark from multiple angles. The light is diffracted, collected and focused on the CCD camera. However, the optics in an FIA system are of a finite size and consequently, some of the diffracted light is lost sometimes causing the image to appear different than the original alignment mark.

FIG. 13 shows a simplified view of an illumination system 130 used in an FIA system. Illumination system 130 includes a light source 132, typically a filtered halogen lamp with wavelengths between approximately 530–800 nm. Light from the light source travels through aperture 134, is reflected by mirror 136 and focused by illumination aperture 138 onto mark 139. The numerical aperture NA of illumination aperture 138 is 0.16 or 0.24 depending on the model of the FIA system, where the numerical aperture NA is equal to sin θ. The light being focused by illumination aperture 138 subtends by an angle of ±9.2° or ±13.8° again depending on the model of the FIA system. Because there are an infinite number of angles for the light between +9.2° and −9.2° as well as between +13.8° and −13.8°, for the sake of simplicity eleven angles corresponding to equally spaced distances across illumination aperture 138 are used as shown in FIG. 14. Because the aperture 138 is a circle, the intensity of the light from each angle is different. The incident angle for each illumination angle is:

$$\theta_n = \arcsin\left(\frac{n}{6} \times NA\right) \qquad \text{equ. 8}$$

where n is the illumination angle between −5 to +5 as shown in FIG. 14, and NA is the numerical aperture of the illumination aperture 138. The relative illumination intensity for each illumination angle is:

$$\text{Intensity} = \sqrt{1 - \left(\frac{n}{6}\right)^2}. \qquad \text{equ. 9}$$

FIG. 15 is a flow chart 150 of a process of simulating the signal waveform for an alignment mark using an FIA sensor.

As with the LSA and LIA processes in FIG. 9, first a stack with N pixels must be generated that accurately represents the alignment mark (Step 151). The complex reflectivities for each pixel in the stack is thn generated as decribed in FIG. 10 (Step 152). However, the LIA simulation generates the complex reflectivities for the stack using a single wavelength at a single illumination angle, but because the FIA system uses multiple wavelengths at multiple illumination angles this process will have to be repeated.

The fft is performed on the complex reflectivities for the stack (Step 153). Because the numerical aperture NA of the collector has a limited size, the orders that are collected are limited. The general equation to determine the diffraction angle On is the following:

$$\sin\theta_n - \sin\theta_i = \frac{n\lambda}{\text{pitch}} \qquad \text{equ. 10}$$

where $\theta_n$ represents the diffraction angle of order "n," $\theta_i$ represents the "i" incident angle, and the pitch is the pitch of the alignment mark, typically 8 μm. The orders that are used are those that are less than or equal to the collector NA of ±0.2 or ±0.3 depending on the FIA system. The remaining orders are eliminated (Step 154). An inverse fft is then performed (Step 155), which generates the image for that wavelength at that illumination angle. Performing an inverse fft on a set of data points is well within the knowledge of those of ordinary skill in the art. For more details on inverse ffts see "Numerical Recipes in C, Second Edition," by Press, Teukolsky, Vettering and Flannery, pp. 537–606, Cambridge University Press, New York (1992), which is herein incorporated by reference.

Figure 24:
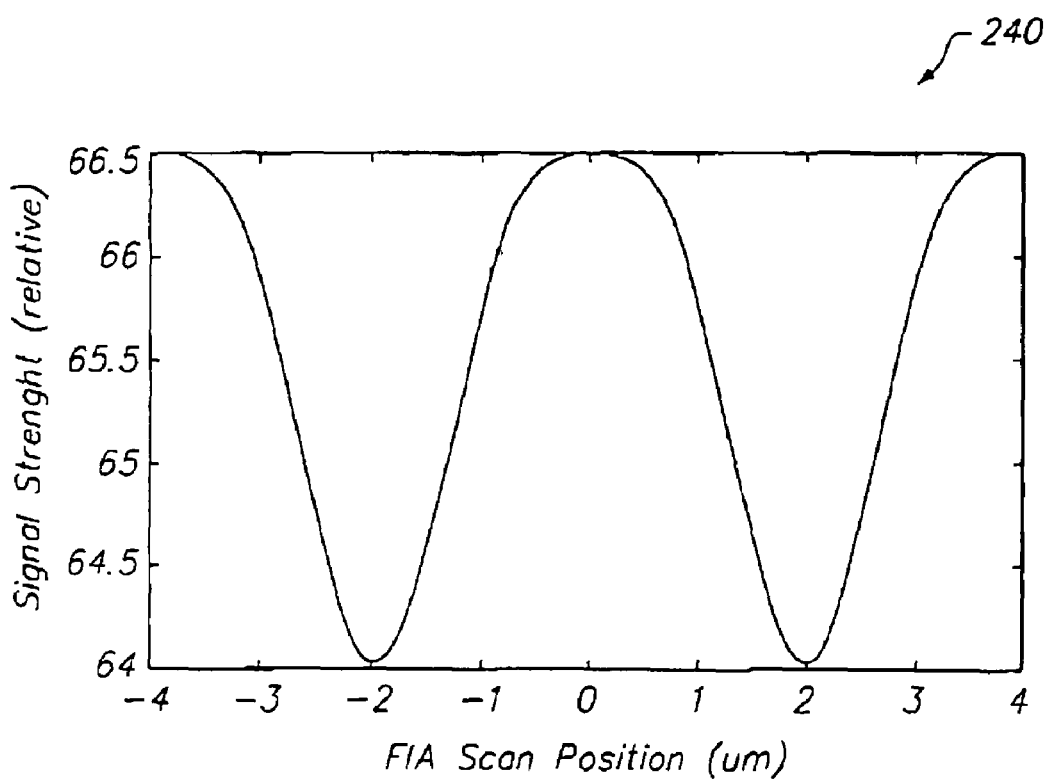
FIG. 24 is a graph showing an example of a FIA signal waveform.
Figure 25:
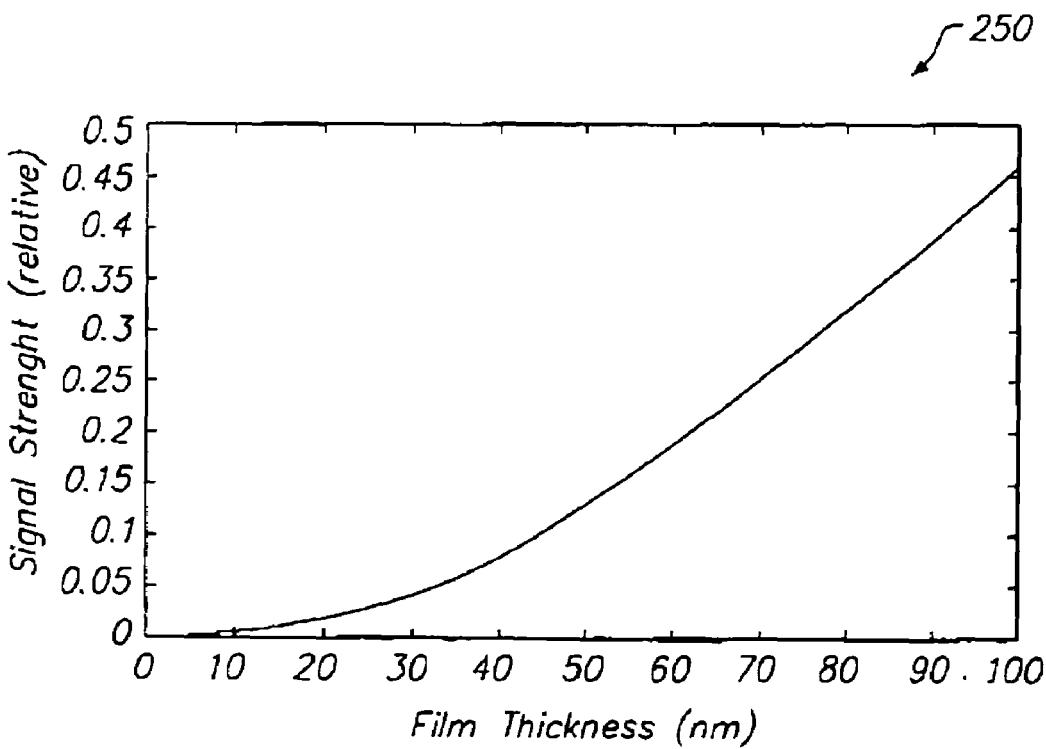
FIG. 25 is a graph showing a FIA contrast or signal strength simulation as a function of layer thickness.

Once the image is generated for that wavelength at that illumination angle, the process is repeated at other wavelengths and other illumination angles. For example, five equally spaced wavelengths and the eleven illumination angles discussed above may be used, however the specific number of illumination angles and wavelengths can be varied as will be appreciated by one of ordinary skill in the art. Thus, the process is repeated for each wavelength and each illumination angle (Steps 155 and 156). The results for each wavelength and each illumination angle are then averaged thereby generating the simulated FIA image of a single alignment mark configuration (Step 157). FIG. 24 shows a graph 240 of an example of a FIA signal waveform. The signal strength or "contrast" for the FIA image is simply the maximum value of the image minus the minimum value of the image. FIG. 25 shows a graph 250 of an example of a FIA contrast waveform or signal strength as a function of a layer thickness.

Of course other types of alignment methods, such as WGA, the Axiom System, and the system used with the Canon 6 Bar can be simulated using the above described methods as will be understood by those of ordinary skill in the art in light of the present disclosure.

Generating Signal Strength as a Function of Layer Thickness and Mark Geometry

Using the above described processes in FIGS. 9, 12 and 15, the signal strength for an alignment mark may be simulated as a function of the layer thickness and mark geometry. Thus, a stack may be generated where the thickness of a single layer or multiple layers may be varied over a desired range and the optimal thickness for the layer or layers can be determined.

1. Single Variable Layer

To simulate the signal strength as a function of a single layer thickness, first a stack must be generated that accurately represents the alignment mark. FIG. 16 is a simple stack 160 having two layers 162 and 164 over a substrate 166. Stack 160 is shown without individual pixels for the sake of clarity. Layer 164 has a thickness $t_1$ that may be varied, for example for 100 nm, while the thickness $t_2$ of layer 162 is fixed. To simulate the signal strength of the alignment mark of stack 160, thickness $t_1$ of layer 164 is set, for example at the minimum thickness, and then the appropriate process is used for generating signal strength for the alignment method being simulated, i.e., LSA, LIA or FIA. Where the FIA method is used from FIG. 15, the contrast of the FIA image is used to simulate the signal strength.

The thickness $t_1$ of layer 164 is then varied by a small amount, for example one percent of the total variable amount of thickness $t_1$. The signal strength is then recalculated. This process is repeated until the signal strength has been simulated for the entire range that thickness $t_1$ may vary. Thus, signal strengths are generated for multiple values of thickness $t_1$. For example, where the value of thickness $t_1$ is changed in one percent increments, three will signal strengths calculated at 101 thickness values, i.e., the smallest and largest thickness plus ninety-nine thickness values in-between. However, it is necessary to check to see if the range of layer thickness is too large (if the range is too large, sub-sampling may occur, which will produce accurate but misleading results). One way to determine whether the range of layer thickness is possibly too large is:

$$\text{if } \left(\Delta > \frac{m \times \lambda}{2 \times ppc \times \bar{n}}\right), \text{ then possibly too large} \qquad \text{equ. 11}$$

where Δ is the range of thickness of the layer, m is equal to 100 for single variable layer, λ is the wavelength of incident light (the shortest wavelength is used for FIA simulation), ppc is points per cycle and is equal to eight, although that number can be higher or lower if desired, and $\bar{n}$ is the real part of the complex index of refraction for the layer.

Figure 17A:
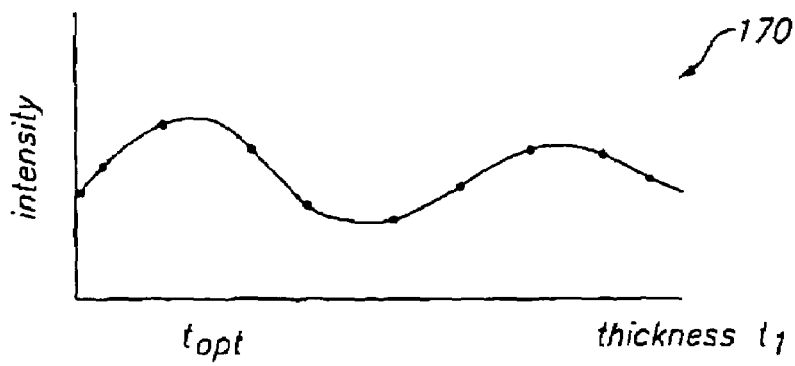
FIG. 17A is a graph showing an example of the diffraction intensity signal as a function of a variable layer thickness.

Thus, a graph 170 shown in FIG. 17A may be generated showing the intensity of the signal as a function of the thickness $t_1$ (graph 170 shows data points at ten percent increments of thickness $t_1$). As shown in graph 170, the peak intensity occurs at the optimal thickness $t_{opt}$.

The same process may be used to simulate the strength of the signal as a function of mark geometry, including changes in smoothing, lateral shift and mark width.

2. Two Variable Layers

The simulation of signal strength as a function of the thickness of two layers is performed in a similar fashion to the Single Variable Layer process described above, however, an additional layer thickness is also varied. Thus, the thickness of a first layer is set at a first value within the first layer's variable range followed by simulations of the signal strength of the stack as a function of thickness of the second layer. Thus, similar to the Single Variable Layer process described above, signal strengths are generated as a function of the first layer set at a first value and the entire range of thickness for the second layer. The thickness of the first layer is then set at a second value within the first layer's variable range, and the signal strength is again calculated as a function of the thickness for the second layer. Thus, a second set of signal strengths are generated as a function of the first layer set at a second value and the entire range of thickness for the second layer. Thus, the signal strength can be simulated as a function of the entire range of the first layer and the second layer.

Figure 17B:
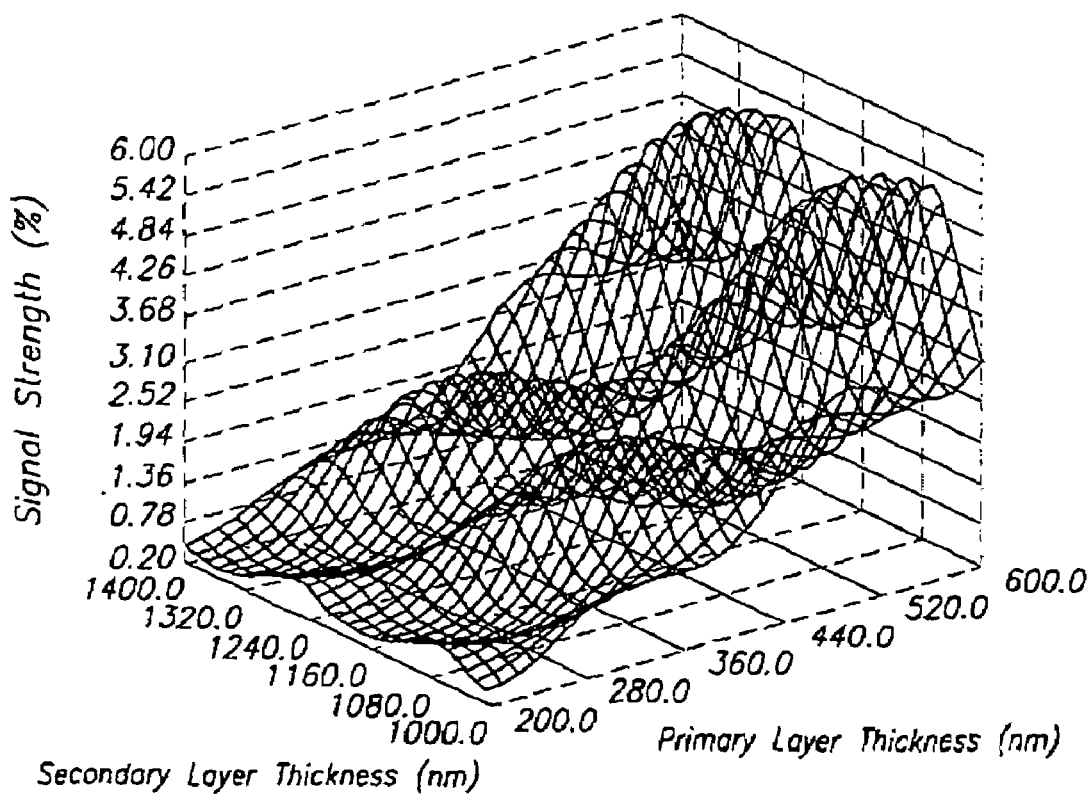
FIG. 17B is an example of a three dimensional graph of the diffraction intensity signal as a function of thickness of two variable layers.

During the simulation of signal strength as a function of two variable layers, the thicknesses of both variable layers are varied by incremental amounts. For example, the first layer thickness may be varied such that there are simulations for thirty one different thicknesses of the first layer. The second layer is similarly varied. Where both variable layers are varied such that each have thirty one data points, there will be a total of 961 data points (31×31=961). The 961 data points may then be graphed in a three dimensional form as shown in FIG. 17B. It is again necessary to check to see if the range of layer thickness for either variable layer is too large (if the range is too large, sub-sampling may occur, which will produce misleading results). To determine whether the range of thickness of either variable layer is too large, equ. 11 above is used, where m is equal to 30.

Figure 19:
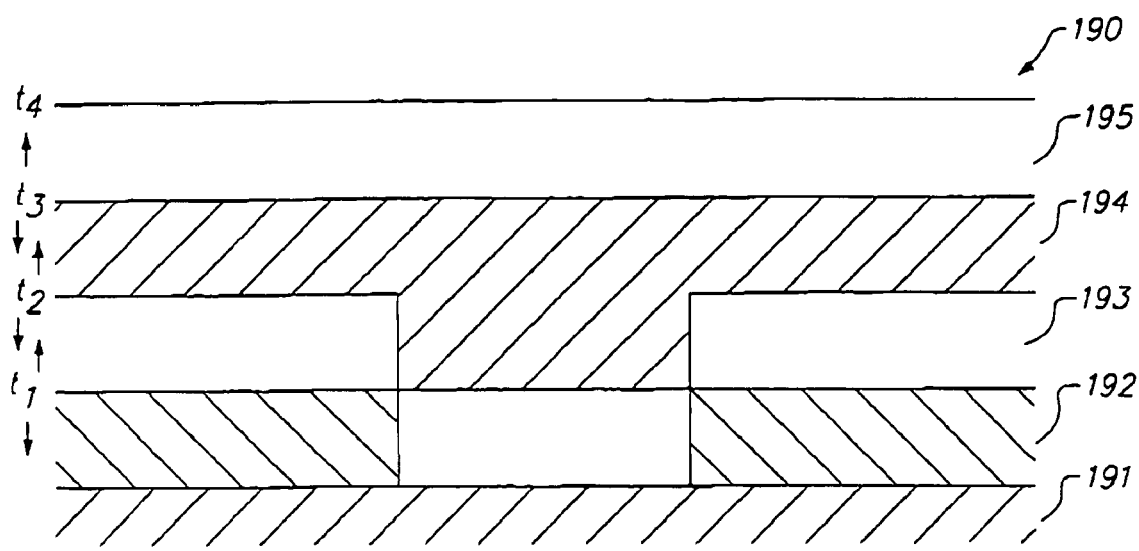
FIG. 19 is a diagram of stack where the thickness of multiple layers may be varied.

3. Multiple Variable Layers

Where the signal strength is simulated as a function of the thickness of multiple layers an iterative process is used. FIG. 18 is a flow chart 180 of the process of simulating the signal strength of an alignment mark as a function of thickness of multiple layers. Again, a stack accurately representing the alignment mark must first be generated (Step 181) with each layer set at a thickness somewhere within each layers individual range of thicknesses, for example at the minimal thickness. FIG. 19 is a diagram of an exemplary stack 190 where the thickness of multiple layers are to be varied. Stack 190 includes a substrate 191 covered by a first layer 192 of thickness $t_1$, a conformal layer 193 of thickness $t_2$, and two planar layers 194 and 195 of respective thicknesses $t_3$ and $t_4$. As shown in FIG. 19, the thicknesses of layers 192, 193 and 194 may be varied, for example by 100 nm each. It should be understood that the thickness may be varied for as many layers as desired and that three layers are used in the present example for illustrative purposes only.

Figure 20:
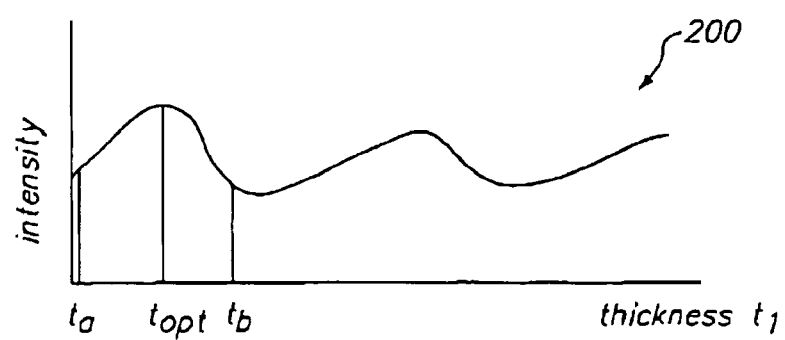
FIG. 20 is a graph showing an example of the diffraction intensity signal as a function of the bottom layer thickness.

The signal strength is then generated as described in reference to FIGS. 16 and 17 for stack 190 as a function of the thickness of any "mark layers," i.e., any layer where the thickness between regions A and region B differ, such as bottom layer 192 (Step 182). For a Multiple Variable Layer process, the incremental changes made to the thickness of the layer in the first iteration is such that the number of data points are the minimum amount necessary. The number of data points used in the first iteration is based on the range of thickness and the index of refraction for that layer as follows:

$$\text{Number of Data Points} = 20 \times (\text{range of thickness}) \times \frac{\text{index of refraction}}{\lambda} + 1 \qquad \text{equ. 12}$$

where $\lambda$ is the wavelength of incident light. It should be understood, of course, that the number of data points used and the method of determining that number may vary if desired. Where the FIA method is used from FIG. 15, the contrast of the FIA image is used to simulate the signal strength and the lowest wavelength is used for $\lambda$. FIG. 20 shows a graph 200 of the intensity of the signal as a function of the thickness $t_1$ where the peak intensity occurs at thickness $t_{opt}$.

The stack is then regenerated setting the first layer, e.g., bottom layer 192, at the optimized thickness $t_{opt}$ as shown in graph 200 (Step 183). The signal strength is then generated for any other mark layers. Where there are no other mark layers, the next variable planar/conformal layer, such as layer 193 is used. The number of data points used for the next layer are derived according to equ. 12. Thus, the optimal thickness for the next variable layer, i.e., layer 193, is derived. (Step 184). The stack is then regenerated with optimized thicknesses for layers 192 and 193. This process is repeated until all variable layers in the stack have been optimized (Step 184). Of course if there are more variable layers, the process repeats until they all have been optimized. The order in which the layers are optimized is first any mark layers, then any planar/conformal layers. Where there are more than one type of layer, e.g., two mark layers, the priority is to optimize from the bottom layer up.

Because changing the thickness of one layer will affect the optimization of another layer, another iteration is used to re-optimizing each variable layer. When all the variable layers in the stack have been re-optimized, the re-optimized stack's signal strength is compared to the preceding optimization. When there is little significant improvement, for example when there is less than one percent change in the peak signal strength, the iteration is complete (Step 185). It is again necessary to check to see if the range of layer thickness for the variable layers is too large (if the range is too large, sub-sampling may occur, which will produce misleading results). To determine whether the range thickness of the variable layers is too large, equ. 11 above is used, when m is equal to 1000.

As shown in FIG. 20, the first optimal thickness $t_{opt}$ of layer 192 is located between a lower bound thickness $t_a$ and an upper bound thickness $t_b$. Thus, in subsequent re-optimizations of the thickness $t_1$ of layer 192, there is no need to test the entire variable range of thickness $t_1$. The thickness $t_1$ of layer 192 is therefore only changed in the subsequent re-optimization between thicknesses $t_a$ and $t_b$, thereby improving the accuracy of the optimization. The formulas to determine the lower bound and upper bound thicknesses around the optimum thickness is as follows:

$$\text{Lower Bound} = \text{Optimum} - \left( \frac{\lambda}{(2 \times (\text{index of refraction})) \times \text{iteration} \times 10} \right) \qquad \text{equ. 13}$$

$$\text{Upper Bound} = \text{Optimum} + \left( \frac{\lambda}{(2 \times (\text{index of refraction})) \times \text{iteration} \times 10} \right) \qquad \text{equ. 14}$$

After the first iteration, twenty one equidistant data points are taken between the lower bound and the upper bound. However, in each subsequent iteration, a new lower bound and upper bound may be calculated and thus, although the same amount of data points is used, the sample density is increased.

Figure 21:
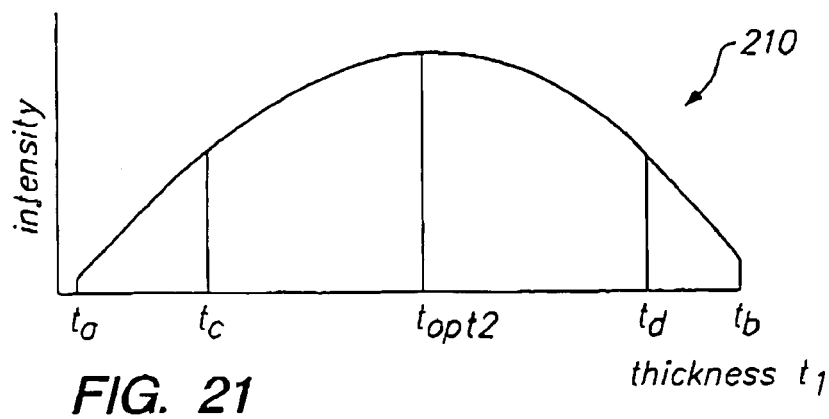
FIG. 21 is a graph of the re-optimization of the bottom layer thickness with a variable thickness range between $t_a$ and $t_b$.

FIG. 21 is a graph 210 of the re-optimization of the thickness $t_1$ of layer 192 where the range of the thickness $t_1$ varies from $t_a$ to $t_b$. As shown in graph 210, each re-optimization of layer 192 is derived in a similar manner, thus the next re-optimization of layer 192 uses the range surrounding thickness $t_{opt2}$, i.e., between thicknesses $t_c$ and $t_d$. Each layer of the stack is re-optimized in a similar manner. As will be understood by those of ordinary skill in the art, where the thicknesses of more than two layers are varied, a numerical result is used giving the optimized thickness for each layer.

As with simulating signal strength as a function of a single layer thickness, the processes for simulated signal strength as a function of multiple variable layers may be used to simulate the strength of the signal as a function of mark geometry, including changes in smoothing, lateral shift, mark width, and any combination thereof along with layer thickness.

Two Region Matching

Two region matching is used to optimize the parameters of an artifact wafers used with the Automatic Measurement System ("AMS"). The AMS system typically measures the relative distance between two alignment marks, which are in two different regions but are near each other. The first mark is laid down during a first exposure and the second mark is laid down during a subsequent exposure that is aligned with the first mark. Typically, the second alignment mark is laid down in photoresist, while the first mark was laid down in an underlying layer.

Figure 22:
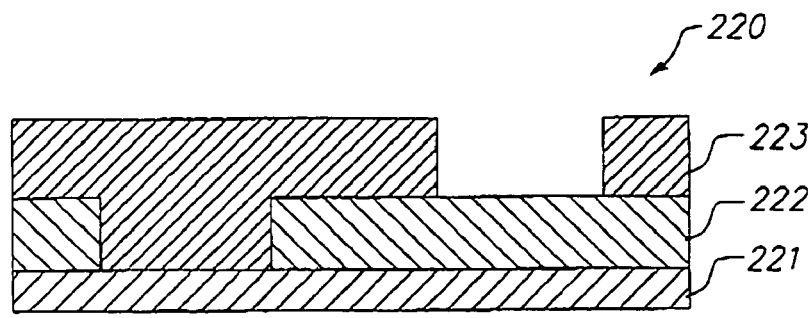
FIG. 22 shows a stack with two marks in different regions.

FIG. 22 shows a stack 220 with two layers 222 and 223 over a substrate 221. Layer 222, which is oxide for example, has one alignment mark and layer 223, which is resist for example, has the other alignment mark. By measuring the relative distance between the two alignment marks, the alignment error of the system can be determined. However, often the two alignment marks will generate drastically different signal strengths. Because some alignment systems, such as LSA and FIA AMS cannot adjust the gain within a single scan, it is difficult to accurately determine the relative distance between the two alignment marks when they generate drastically different signal strengths. Thus, it is desirable to have the signal strengths of the two regions matched in order to accurately determine the relative distance between the two alignment marks. Consequently, there is a need to determine the optimum mark depth or layer thickness.

Figure 23:
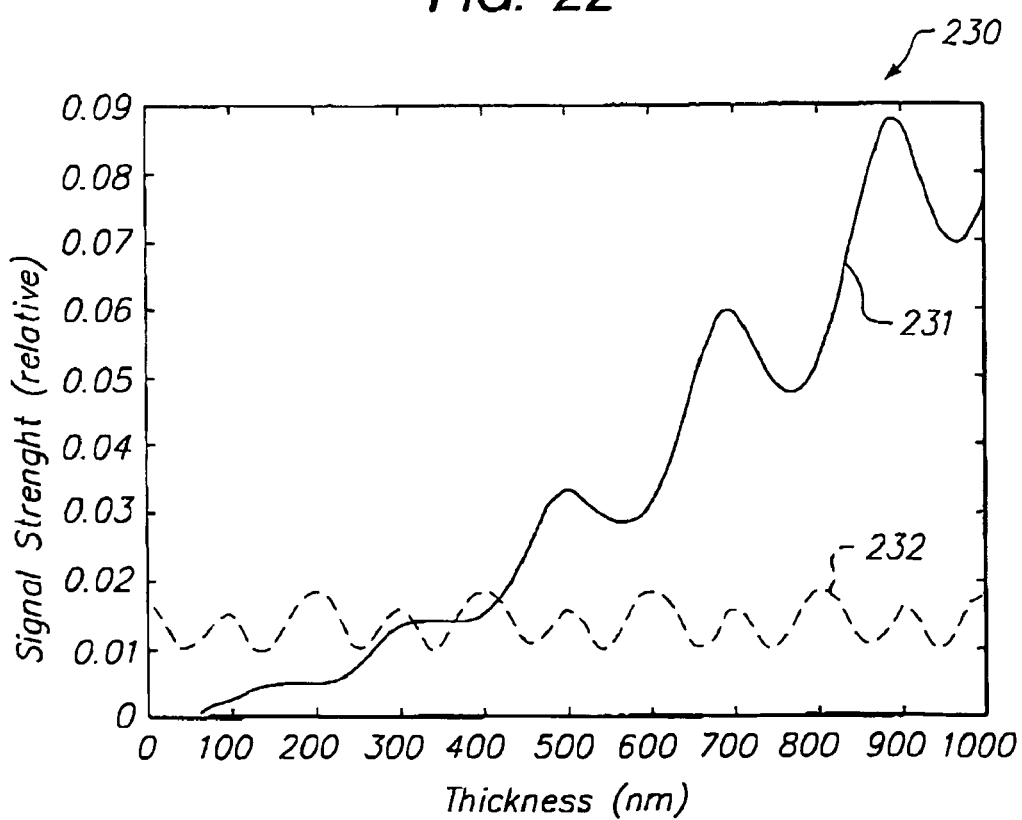
FIG. 23 is a graph showing the relative signal strength as a function of single layer thickness in the stack of FIG. 22 using the LSA process.

Thus, the signal strengths of each alignment mark is generated as a function of the layer thickness as described in reference to FIGS. 16 and 17. FIG. 23 is a graph 230 showing the relative signal strength as a function of layer 222 thickness using the LSA process. Curve 231 represents the signal strength generated by the mark in layer 222, as shown in FIG. 22, and curve 232 represents the signal strength of the mark in layer 223. As can be seen in graph 230 there are three intersections between curves 231 and 232 at approximate thicknesses 310 nm, 370 nm, and 410 nm, where the 410 nm thickness provides the best signal. Thus, layer 222 in stack 220 has an optimal thickness of 410 nm. It is again necessary to check to see if the range of layer thickness for the variable layer is too large (if the range is too large, sub-sampling may occur, which will produce misleading results). To determine whether the range thickness is too large, equ. 11 above is used, where m is equal to 100.

Generating Signal Waveform

The alignment signal waveform for a given alignment mark configuration may be simulated for various alignment systems, such as FIA, LIA, and LSA.

1. Field Image Alignment ("FIA")

Because the FIA system is an imaging system, the FIA signal waveform is the image generated by the process described in reference in FIGS. 13–15. FIG. 24 is a graph 240 showing an example of a FIA signal waveform, where the Y axis represents the relative signal strength, and the X axis represents the scan position in micrometers. By way of comparison, FIG. 25 is a graph 250 of a FIA contrast or signal strength simulation as a function of layer thickness generated as described in reference to FIGS. 13–17.

2. Laser Interferometric Alignment ("LIA")

The alignment signal waveforms for an LIA system are sine waves with the appropriate amplitude and phase. The amplitude of the sine wave is equal to one half the intensity as generated in the processes described in reference to FIG. 12. The phase of the sine waves is the difference in the phase angles of the fft results as performed in block 124 of FIG. 12 according to the following:

$+1/-1\text{phase}=\phi\mathit{fft}(+1)-\phi\mathit{fft}(-1)$ $0/+2\text{phase}=\phi\mathit{fft}(0)-\phi\mathit{fft}(+2)$ $0/-2\text{phase}=\phi\mathit{fft}(0)-\phi\mathit{fft}(-2)$ where +1/−1 phase represents the difference in phase between the +1 and −1 order, 0/+2 phase represents the difference in phase between the 0 and +2 order, 0/−2 phase represents the difference in phase between the 0 and −2 order, and $\phi$fft(+1), $\phi$fft(−1), $\phi$fft(0), $\phi$fft(+2), $\phi$fft(−2) represent the phase angles of the respective +1, −1, 0, +2, and −2 order results of the fast fourier transform.

Figure 26:
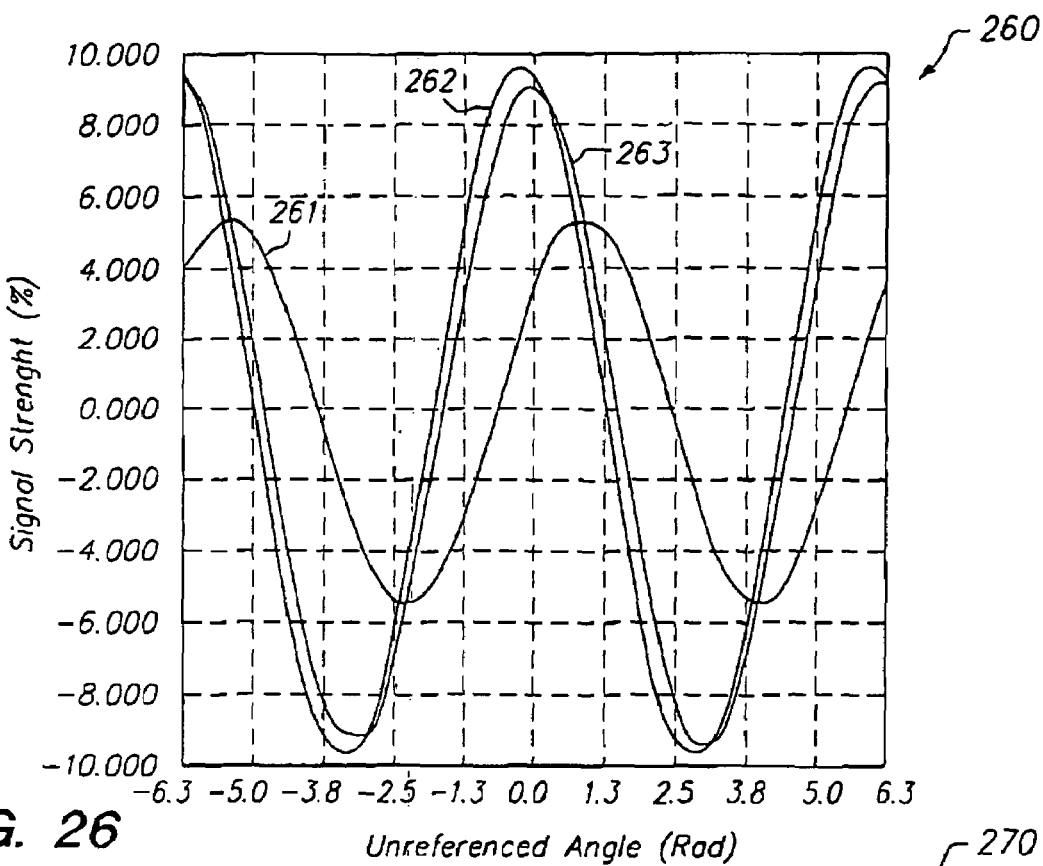
FIG. 26 is a graph showing an example of a LIA signal waveform.

FIG. 26 is a graph 260 showing an example of a LIA waveform, where the Y axis represents the relative signal strength and the X axis represents the interference angle in terms of radians. As shown in graph 260, there are three LIA waveforms 261, 262, and 263 representing the ±1 order, the 0/+2 order, and the 0/−2 order, respectively. By way of comparison, FIG. 27 is a graph 270 of a LIA signal strength simulation as a function of layer thickness generated as described in reference to FIGS. 12, 16 and 17. Although only two waveforms are shown in graph 270 there are actually three, but the 0/+2 order and 0/−2 order overlap. Thus, waveform 271 represents the +1/−1 order and waveform 272 represents both the 0/+2 order and the 0/−2 order.

3. Laser Step Alignment ("LSA")

The LSA system uses a dynamic or scanning sensor. The method described in reference to FIGS. 9 through 11 generates the intensity of the signal when the laser is fixed at a specific position, e.g., centered on the alignment mark. To calculate the LSA waveform signal this process must be repeated at multiple places or "slices" along the alignment mark.

Figure 28:
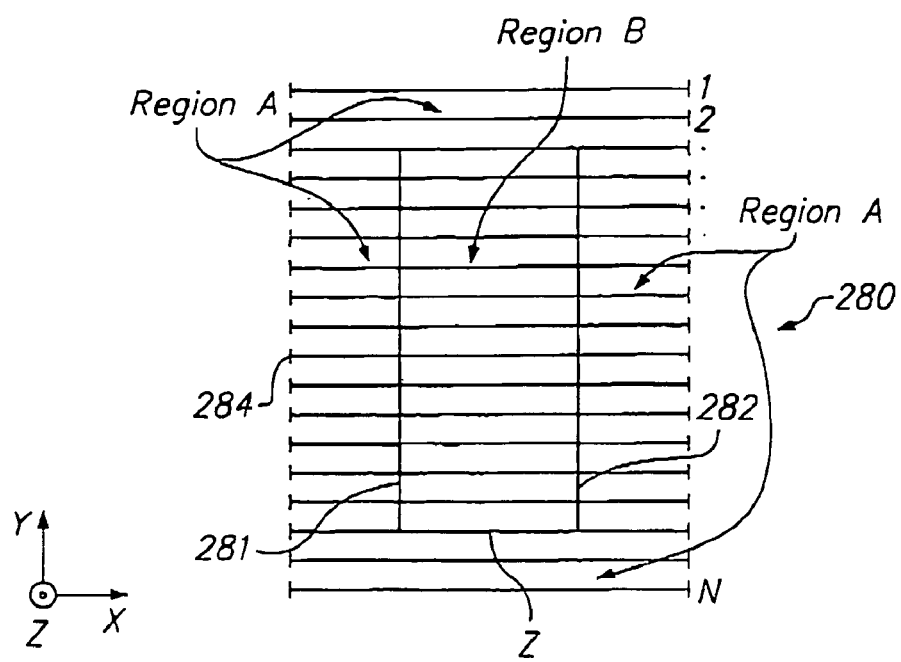
FIG. 28 is a plan view of an alignment mark with a series of bars representing a number of slices along alignment mark to be used in generating an LSA waveform signal.
Figure 29:
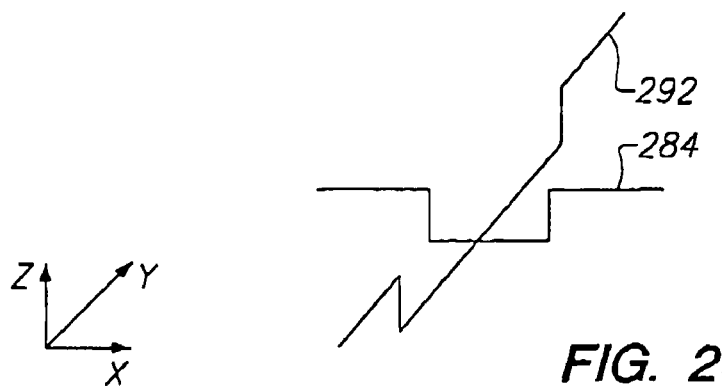
FIG. 29 shows a center horizontal slice and a vertical slice defining the shape of the alignment mark shown in FIG. 28.

FIG. 28 shows a plan view of an alignment mark 280 with a series of slices 1, 2, . . . N along the alignment mark 280. A stack is generated that represents the center slice 284 of alignment mark 280 including the width of region A, layer thicknesses and composition, smoothing values of the left and right side walls 281 and 282 as well as region A and/or region B. A stack is then generated in a similar manner that represents a vertical slice of the alignment mark including the length L of the mark, and smoothing values of the top and bottom sidewalls 283 and 284 as well as region A and/or region B. The vertical slice stack is comprised of a series of pixels similar to the horizontal slice stack. FIG. 29 shows an example of the center horizontal slice 284 and the vertical slice 292. It should be understood that vertical slice 292 is used only to generate the remaining horizontal slices 1 through N shown in FIG. 28 and is not actually used in the generation of the LSA signal waveform.

Figure 30:
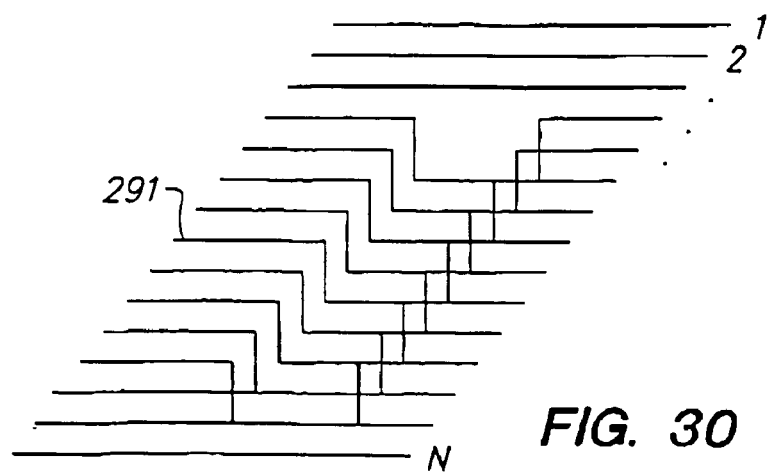
FIG. 30 shows a series of horizontal slices forming a framework of the alignment mark shown in FIG. 28.

Stacks are generated for the remaining horizontal slices by using a nested double loop, where the pixels of the vertical slice stack are looped through first and then the pixels of the horizontal slice stack. Thus, the first pixel of vertical slice stack is compared to each pixel in the horizontal slice stack. If the alignment mark is a "negative" mark, i.e., region A is higher than region B, then the higher pixel of the horizontal slice stack or the vertical slice stack is used. If the alignment mark is a "positive" mark, i.e., region B is higher than region A, then the lower of the pixels between the horizontal slice stack and the vertical slice stack is used. In this manner, the first horizontal slice stack is generated. Then the process is repeated for each subsequent pixel in the vertical slice stack until all stacks have been generated for all the horizontal slices 1 through N. In this manner a three dimensional framework of alignment mark 280 is generated using horizontal slices as shown in FIG. 30. It should be understood that while alignment mark 280 has no smoothing, this process is used for marks that have smoothing as well as any other attributes, such as lateral shift.

The diffraction intensity for all the horizontal slices 1 through N is then generated as discussed in reference to FIGS. 9–11. Thus, where 256 individual slices are used, there will be 256 individual diffraction intensities. Where 256 pixels are used and the pitch of the alignment mark is 8 µm, each pixel is 31.25 nm wide. Further, each slice is considered to be a pixel in width, i.e., 31.25 nm. Consequently, the laser beam used in the LSA system is wider than an individual pixel and a slice. Thus, each individual diffraction intensity is convoluted with the gaussian profile of the LSA laser beam, which is the following:

$$\text{profile}(x) = e^{-2(\frac{x}{1.5})^2} \quad \text{equ. 16}$$

where profile(x) is the gaussian profile of the LSA laser beam along the scanning position x measured in micrometers. By convoluting the LSA diffraction intensities with the gaussian profile of the LSA laser beam, the LSA signal waveform is generated.

FIG. 31 is a graph 310 showing an example of a LSA waveform signal 311, where the Y axis represents the signal strength and the X axis represents the scan position in micrometers. By way of comparison, FIG. 32 shows a graph 320 of a LSA signal strength simulation as a function of a layer thickness generated as described in reference to FIGS. 9–11, 16 and 17.

Figure 33:
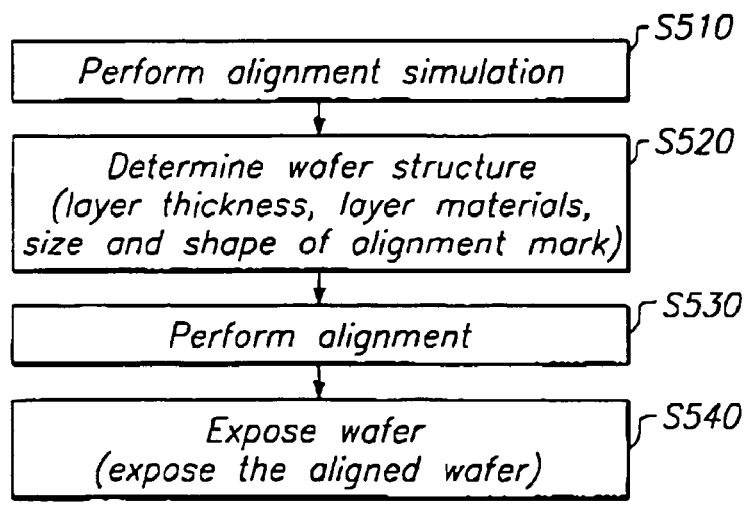
FIG. 33 is a flow chart of the process of an alignment simulation and process of an exposure operation.

FIG. 33 shows a flow of steps from an operation of an alignment simulation to an exposure operation which exposes a wafer having a structure determined in the alignment simulation. First, the alignment simulation is performed using the alignment simulator illustrated and explained hereinabove with reference to FIG. 1, or an alignment simulator 500 illustrated in FIG. 34 (step S510). Next, a structure of the wafer is determined by the alignment simulation of step S510(S520). The structure includes materials and thicknesses of the layers, and size and shape of the alignment marks.

The wafer having the structure determined in step S520 is then placed in an exposure apparatus 400, shown in FIG. 34 and described below, and the wafer is aligned by an alignment system 412 of the exposure apparatus 400 (step S530).

Finally, the wafer aligned in step S530 is exposed by an exposure system 410 (step S540). Via the above described steps S510–S540 (process), a micro-device (for example, a semiconductor device) is manufactured by exposing a pattern formed on a reticle onto the wafer.

Figure 34:
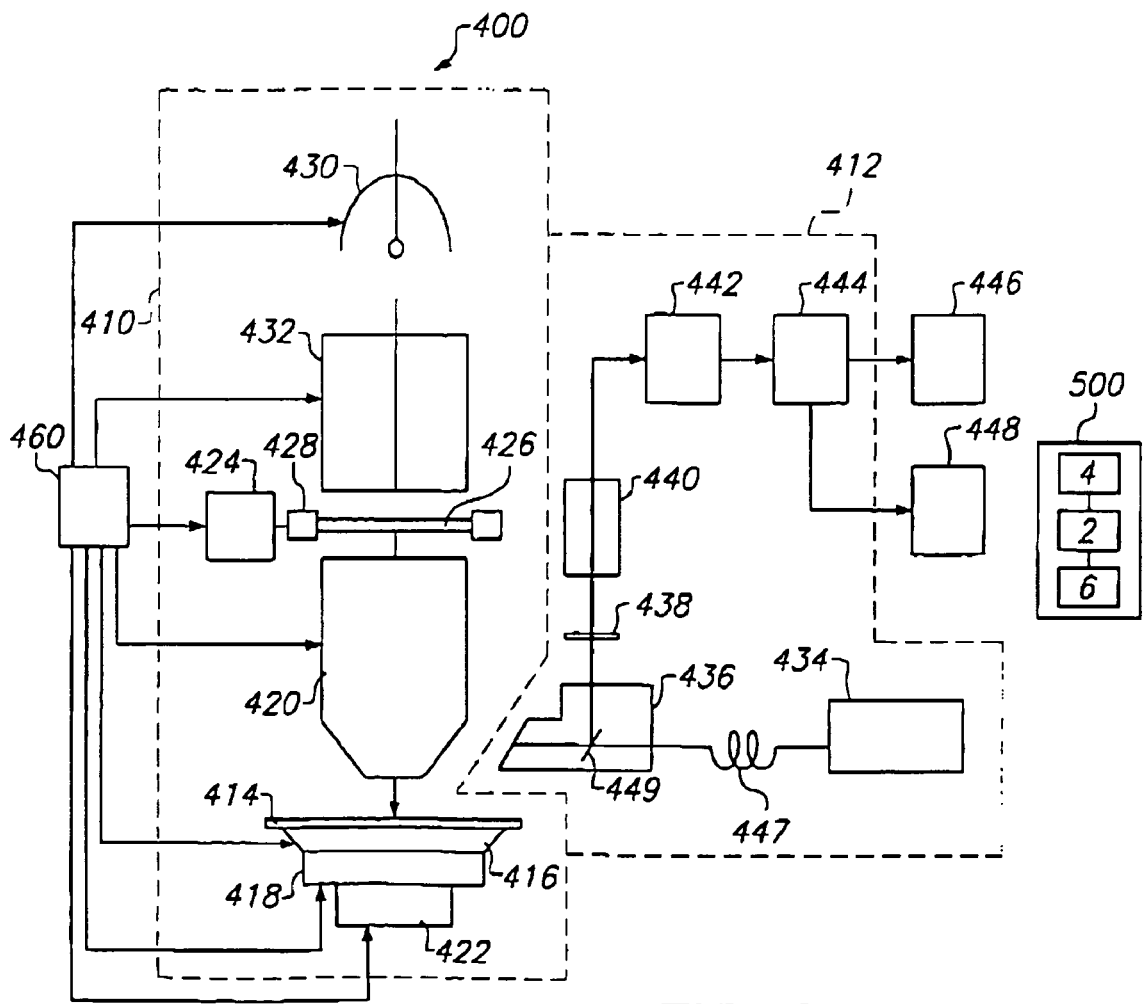
FIG. 34 shows an alignment simulator and exposure apparatus including an exposure system and an alignment system.

The following is an explanation of the exposure apparatus 400 and alignment simulator 500 shown in FIG. 34. The alignment simulator 500 is provided independent from the exposure system 410 and alignment system 412 of the exposure apparatus 400. However, it is not limited to this independent structure. It is possible to perform the alignment simulation in an alignment processing unit 444 and/or a system computer. Further, it is possible to perform the alignment simulation in a main computer 460 coupled to the exposure system 410.

In FIG. 34, the process program of the above alignment simulation method is installed in the alignment simulator 500. However, the installation of the program is not limited to this environment. It is possible to install the program of the alignment simulation in the alignment processing unit 444, the system computer 446, or the main computer 460. Further, it is possible to use a storage medium (for example, electric memory, floppy disk, and the like), on which the process program of the alignment simulation method is stored, which is removable/detachable from the alignment simulator 500. When the storage medium is inserted into the alignment simulator 500, the process program causes the alignment simulator 500 to perform the alignment simulation method.

FIG. 34 is a schematic representation of a projection exposure apparatus 400 including an exposure system 410 and an alignment system 412 for processing a substrate, such as a wafer 414 which is determined by the alignment simulator 500. The wafer 414 is held by vacuum suction on a wafer holder 416 which is supported on a wafer stage 418 under the projection lens 420 of the exposure system 410. The wafer holder 416 and wafer stage 418 are structured so that they can be moved in several (e.g., three to six) degrees of freedom by servomotors 422 under precision control, to position the wafer 414 at a desired position relative to the projection system 420 and/or in accordance with a step-and-repeat exposure process. A reticle 426 is set on a reticle stage 428 that is two-dimensionally movable and rotatable in several (e.g., three or six) degrees of freedom by a servomotor 424. The servomotor 424 is precisely controlled to position the reticle 426 with respect to the optical axis of the projection system 420. Projection illumination from a lamp 430 (e.g., a high pressure mercury vapor lamp) is directed towards the reticle 426 through a series of lenses, shutters, filters, beam splitters and mirrors (not shown) in an illumination system 432, such that most of the illumination emitted from the illumination system 432 has a wavelength band to which a photoresist is sensitive. The illumination through a condenser lens (not shown) in the illumination system 432 illuminates uniformly a pattern area of the reticle 426, which pattern is projected onto the wafer 414 which has a photoresist layer on the surface thereof. A main computer 460 is electrically connected to the wafer stage 418, the wafer holder 416, the projection lens 420, the servomotors 422, the reticle stage 428, the servomotor 424, the lamp 430 and the illumination system 432, and controls these elements. Other details of the above described projection exposure system 410 can be found in U.S. Pat. No. 5,601,957, which has been fully incorporated by reference herein.

Provided on one side of the projection system 420 is the alignment system 412 which image processes an alignment mark 20 on the wafer 414 (see also FIG. 2) by an off-axis method. The alignment system 412 is mounted in relation to the projection lens 420 such that the broadband illumination of the alignment system 412 is projected below the projection system 420. Generally, the alignment system 412 consists of a broadband illumination white light halogen lamp 434 (preferably located on the top of the wafer processing chamber to prevent heat penetration into the wafer processing system), a microscope system 436, a target plate 438, a beam expander 440, an image pickup element such as a CCD camera 442, and an alignment processing unit 444. The alignment system 412 is coupled to a system computer 446 and display 448.

During alignment, non-exposure wavelength light from the lamp 434 is sent to the microscope system 436 through a fiber optic bundle 447 to illuminate the wafer 414. The reflected light from the wafer 414 is then returned through the same microscope system 436 but diverted to the target plate 438 by a beam splitter 449. An image of the wafer alignment mark is formed on the transparent window of the target plate 438. The image of the wafer alignment mark thus formed is converted into a video signal by the CCD camera 442 and sent to the alignment-processing unit 444. The alignment determination functions and calculations are performed by the alignment processing unit 444. The alignment results are then processed by the system computer 446 to control the wafer stage 418 and/or reticle stage 428 positions before exposure of the wafer 414. The alignment system 412 may be configured to detect alignment positions in two orthogonal directions. For some systems, a second alignment system may be provided for detecting the position of a second wafer alignment mark which is located along a second direction (e.g., Y-direction) in the plane of the wafer 414 and orthogonal to the direction (e.g., X-direction) of the wafer alignment mark detected by the above alignment system 412.

It is noted that configuration of the alignment system 412 as illustrated in FIG. 34 generally corresponds to a Field Image Alignment system. Further details of the optical configuration within such a system may be referenced from U.S. Pat. No. 5,601,957, which has been fully incorporated by reference herein. It is to be understood that the present invention disclosed herein is not to be limited to wafer alignment systems, and specifically to Field Image Alignment systems.

The present invention is applicable to a scanning type exposure apparatus (disclosed in U.S. Pat. No. 5,473,410) which exposes the pattern formed on the reticle 426 onto the wafer 414 while synchronously scanning the reticle 426 and the wafer 414, or a step and repeat type exposure apparatus which exposes the pattern formed on the reticle 426 onto the wafer 414 while the reticle 426 and wafer 414 are held stationery. The present invention is also applicable to a proximity type exposure apparatus which exposes the pattern formed on the reticle 426 onto the wafer 414 without the use of the projection system 420 in the exposure system 410. The present invention is additionally applicable to an exposure apparatus that uses a reduction type projection system or magnification type projection system as the projection system 420. Further, the micro device set forth above can include semiconductor devices, substrates for liquid crystal display devices, substrates for magnetic heads and other integrated circuit pattern devices.

Although the present invention has been described in considerable detail with reference to certain versions thereof, other versions are possible. For example, other types of alignment methods may be simulated using the processes described herein. Therefore, the spirit and scope of the appended claims should not be limited to the description of the versions depicted in the figures but should be construed to include changes and modification as will be recognized by one skilled in the art.

What is claimed is:

1. A method of generating a signal strength for a cross sectional model of an alignment mark used in integrated circuit manufacturing comprising:
   generating a cross sectional model of an alignment mark having at least one layer, said model comprised of a plurality of pixels, wherein each pixel defines a thickness and an index of refraction associated with each layer within said pixel;
   generating a complex reflectivity for each pixel within said model; and
   generating a signal strength for said model by generating a diffraction intensity for said model by performing a fast fourier transform on said plurality of pixels of said model and multiplying at least two orders of the fast fourier transform results by their respective complex conjugates and summing the results together.

2. The method of claim 1, further comprising selecting for use in semiconductor fabrication a particular alignment mark based on the generated signal strength.

3. The method of claim 1, wherein said generating a cross sectional model of an alignment mark having at least one layer comprises:
   generating a bottom layer representing said alignment mark, said bottom layer being comprised of a plurality of pixels, each pixel having a first thickness and a first complex index of refraction associated with said layer;
   wherein said first thickness in each pixel may vary in accordance with the change of thickness of said bottom layer.

4. The method of claim 3, further comprising generating an overlying layer over said bottom layer, said overlying layer being comprised of said plurality of pixels, each pixel having a second thickness overlying said first thickness and a second index of refraction associated with said overlying layer.

5. The method of claim 3, further comprising smoothing said at least one layers wherein said smoothing comprises:
   providing a slope to a region of said at least one layer;
   determining an averaging window size of the region having a slope;
   generating a gaussian distribution according to the following:

$$\text{average}(i) = \exp\left(-0.001 \times \left(i - \left(\frac{\text{window size} - 1}{2} + 1\right)\right)^2\right)$$

where i signifies the number of the pixel in the averaging window, average(i) represent the average value of pixel i;
   totaling the average values for the pixels in the averaging window;
   averaging each pixel with a neighboring pixel; and
   dividing the average by the total of said average values.

6. The method of claim 1, wherein said generating the complex reflectivity for each pixel within said model comprises:
   calculating the phase of the light in each layer of each pixel; wherein the phase of light for each layer is the following:

$$\phi_x = \frac{2\Pi \hat{n}_x t_x}{\lambda}$$

where $\phi_x$ is the phase of light in layer x, $\hat{n}_x$ represents the associated complex index of refraction with layer x, $t_x$ represents the thickness of layer x, and $\lambda$ represents the wavelength of light;

generating the Fresnel reflectivity at each interface between layers in each pixel, wherein the Fresnel reflectivity $\hat{r}_x$ for layer x is the following:

$$\hat{r}_x = \frac{\hat{n}_{x+1} - \hat{n}_x}{\hat{n}_{x+1} + \hat{n}_x}$$

where $\hat{n}_x$, represents the associated complex index of refraction with layer x and $\hat{n}_{x+1}$ represents the associated complex index of refraction with layer x+1;

generating a characteristic matrix for each layer in each pixel, wherein said characteristic matrix $\overline{C}_x$ for layer x is the following:

$$\overline{C}_x = \begin{bmatrix} e^{i\phi_x} & \hat{r}_x e^{i\phi_x} \\ \hat{r}_x e^{-i\phi_x} & e^{-i\phi_x} \end{bmatrix}$$

where $\phi_x$ is the phase of light in layer x, and $\hat{r}_x$ is the Fresnel reflectivity at layer x;

multiplying the characteristic matrices for each layer in each pixel from the top layer down generating a resultant characteristic matrix; and dividing the number in the second row first column of the resultant characteristic matrix by the number in the first row first column of the resultant characteristic matrix thereby generating the total complex reflectivity for each pixel.

7. The method of claim 6, wherein the resulting +1, +2, +3, −1, −2, and −3 orders are multiplied by their respective complex conjugates.

8. The method of claim 1, wherein generating the diffraction intensity for the model further comprises:

using the following equations on the fast fourier transform results $$\frac{+1}{-1} \text{intensity} = 4 \times \sqrt{|\mathit{fft}(+1)|^2 \times |\mathit{fft}(-1)|^2}$$

$$\frac{0}{+2} \text{intensity} = 4 \times \sqrt{|\mathit{fft}(0)|^2 \times |\mathit{fft}(+2)|^2}$$

$$\frac{0}{-2} \text{intensity} = 4 \times \sqrt{|\mathit{fft}(0)|^2 \times |\mathit{fft}(-2)|^2}$$

where +1/−1 intensity represents the diffraction intensity of the interference between the +1 and −1 orders, the 0/+2 intensity represents the diffraction intensity of the interference between the 0 and +2 orders, the 0/−2 intensity represents the diffraction intensity of the interference between the 0 and −2 orders, fft(+1) represents the +1 order result of said fast fourier transform, fft(−1) represents the −1 order result of said fast fourier transform, fft(O) represents the 0 order result of said fast fourier transform, fft(+2) represents the +2 order result of said fast fourier transform, and fft(−2) represents the −2 order result of said fast fourier transform.

9. The method of claim 1, further comprising:

calculating the diffraction orders that will not be collected because of an aperture of a collector;

eliminating from the fast fourier transform result said diffraction orders that will not be collected;

performing an inverse fast fourier transform on the remaining orders of the fast fourier transform result thereby generating a first image;

wherein said generating the complex reflectivity for each pixel within said model is performed for a single wavelength at a single illumination angle and said first image is for said single wavelength at said single illumination angle;

generating at least one additional image for at least one additional wavelength at said single illumination angle;

generating a second at least one additional image for said single wavelength at an at least one additional illumination angle; and generating a resulting image by averaging together said first image, said at least one additional image, and said second at least one additional image.

10. The method of claim 9, wherein said generating at least one additional image for at least one additional wavelength is performed over a range of wavelengths from 530 to 800 nm, and said generating a second at least one additional image for said single wavelength at an at least one additional illumination angle is performed over a range of illumination angles of at least one of +9.2° to −9.20 and +13.80 to −13.80.

11. The method of claim 9 further comprising generating a contrast of the resulting image by taking a difference between the maximum value of the resulting image and the minimum value of the resulting image.

12. The method of claim 1, further comprising finding the optimal thickness of a first layer of said alignment mark, wherein said finding the optimal thickness comprises:

generating at least one additional model of said alignment mark, wherein the thickness of said first layer is varied within a first range for each at least one additional model;

generating the complex reflectivity for each pixel within each at least one additional model;

generating the signal strength for each at least one additional model; and comparing the peak signal strengths for all of the models, wherein the highest signal strength is provided by the optimal thickness of said first layer.

13. The method of claim 12, further comprising finding the optimal thickness of said first layer and of a second layer of said alignment mark, wherein said finding the optimal thickness comprises:

generating said at least one additional model of said alignment mark, wherein the thickness of said first layer is varied within a first range for each at least one additional model and the thickness of said second layer is set at a first value;

generating additional models of said alignment mark after said generating the signal strength, wherein the thickness of said first layer is varied within a first range for each additional model and the thickness of said second layer is independently varied within a second range for each additional model;

generating the complex reflectivity for each pixel within each additional model; and generating the signal strength for each additional model until a signal strength has been generated for the entire range of thicknesses for both said first layer and said second layer.

14. The method of claim 12, further comprising finding the optimal thickness of second layer of said alignment mark, wherein said finding the optimal thickness of said second layer comprises:
generating multiple optimized models of said alignment mark, each of said multiple optimized models having said optimal thickness of said first layer and having a different thickness of said second layer within a second range;
generating the complex reflectivity for each pixel within each of said multiple optimized models;
generating the signal strength for each of said multiple optimized models; and
comparing the peak signal strengths for all the multiple optimized models, wherein the highest signal strength is provided by the optimal thickness of said second layer.

15. The method of claim 14, further comprising:
generating multiple re-optimized models of said alignment mark, each of said multiple re-optimized models having said optimal thickness of said second layer and having a different thickness of said first layer within a third range, wherein said third range is less than said first range;
generating the complex reflectivity for each pixel within each of said multiple re-optimized models;
generating the signal strength for each of said multiple re-optimized models;
comparing the peak signal strengths for all the multiple re-optimized models, wherein the highest signal strength is provided by the second optimal thickness of said first layer;
generating a second group of multiple re-optimized model of said alignment mark, each of said second group of multiple re-optimized models having said second optimal thickness of said first layer and having a different thickness of said second layer within a fourth range, wherein said fourth range is less than said second range;
generating the complex reflectivity for each pixel within each of said second group of multiple re-optimized models;
generating the signal strength for each of said second group of multiple re-optimized models;
comparing the peak signal strengths for all the second group of multiple re-optimized models, wherein the highest signal strength is provided by the second optimal thickness of said second layer;
comparing the highest signal strength of said second group of multiple re-optimized models with said highest signal strength for the multiple optimized models; and
iteratively repeating the process until the change between highest signal strengths of subsequent optimized modes is below a threshold.

16. The method of claim 12, further comprising optimizing the thickness of said first layer for two alignment marks, wherein optimizing the thickness of said first layer for two alignment marks comprises:
repeating the process for a second alignment mark; and
comparing the optimized thickness for the first layer for both alignment marks, wherein the optimized thickness for said first layer for two alignment marks is where the optimized thickness for the first layer is the same for both alignment marks.

17. A method of generating a total diffraction energy for a series of cross sections of an alignment mark used in integrated circuit manufacturing comprising:
modeling a cross section of an alignment mark having at least one layer, said model comprised of a plurality of pixels, wherein each pixel defines a thickness and a complex index of refraction of said at least one layer;
generating a diffraction intensity of said alignment mark using scalar diffraction, wherein said scalar diffraction includes generating the complex reflectivity for each pixel and performing a fast fourier transform on the complex reflectivity for said plurality of pixels; and
modeling a series of cross sections of said alignment mark, each of said series of cross sections representing a cross section at a different location of said alignment mark, wherein each of said series of cross sections is comprised of a series of pixels.

18. The method of claim 17, further comprising:
generating an alignment signal waveform, wherein said waveform is a sine wave with an amplitude equal to one half the diffraction intensity and the phase of said sine wave is the difference in the phase angles of the fast fourier transform result according to the following:

$$+1/-1\text{phase} = \phi\mathit{fft}(+1) - \phi\mathit{fft}(-1)$$

$$0/+2\text{phase} = \phi\mathit{fft}(0) - \phi\mathit{fft}(+2)$$

$$0/-2\text{phase} = \phi\mathit{fft}(0) - \phi\mathit{fft}(-2)$$

where +1/−1 phase represents the difference in phase between the +1 and −1 order, 0/+2 phase represents the difference in phase between the 0 and +2 order, 0/−2 phase represents the difference in phase between the 0 and −2 order, and $\phi$ fft(+1), $\phi$fft(−1), $\phi$fft(0), $\phi$fft(+2), $\phi$fft(−2) represent the phase angles of the respective +1, −1, 0, +2, and −2 order results of the fast fourier transform.

19. The method of claim 17, further comprising generating the image of said alignment mark, wherein generating the image comprises:
removing the orders from the fast fourier transform result that are not collected by an aperture of a collector in the alignment system being simulated;
performing an inverse fast fourier transform on the remaining orders from the fast fourier transform result generating an image of said alignment mark for one wavelength at one illumination angle;
repeating the process for a range of illumination angles based on the aperture size of the lens generating images of said alignment mark for one wavelength at multiple illumination angles;
repeating the process for a range of wavelengths generating images of said alignment mark for multiple wavelengths at multiple illumination angles; and
averaging the results of said images of said alignment mark for multiple wavelengths at multiple illumination angles.

20. The method of claim 17, further comprising:
generating the total diffracted energy for said each of said series of cross sections using scalar diffraction, wherein said scalar diffraction includes generating the complex reflectivity for each pixel, performing a fast fourier transform on the complex reflectivity for said series of pixels, generating the intensity of the resulting orders of said fast fourier transform by multiplying said resulting orders by their complex conjugates and summing said intensity of the resulting orders resulting in the total diffracted energy for said each of said series of cross sections; and convoluting each total diffracted energy by the gaussian profile of the illumination beam.

21. The method of claim 20, wherein said gaussian profile of the illumination beam is the following:

$$\text{profile}(x) = e^{-2\left(\frac{x}{1.5}\right)^2}$$

where profile(x) is the profile of the beam along the scanning direction of the beam.

22. A programmed computer for performing a simulation of generating a signal strength for a cross sectional model of an alignment mark used in integrated circuit manufacturing, said simulation comprising:

generating a cross sectional model of an alignment mark having one or more layers, said model comprised of a plurality of pixels, wherein each pixel has a thickness and an index of refraction associated with each layer within said pixel;

generating a complex reflectivity for each pixel within said model; and generating a signal strength for said model by generating a diffraction intensity for said model by performing a fast fourier transform on said plurality of pixels of said model and multiplying at least two orders of the fast fourier transform results by their respective complex conjugates and summing the results together.

23. The computer of claim 22, wherein said generating a cross sectional model of an alignment mark having at least one layer comprises:

generating a bottom layer representing said alignment mark, said bottom layer being comprised of a plurality of pixels, each pixel having a first thickness and a first complex index of refraction associated with said layer;

wherein said first thickness in each pixel may vary in accordance with the change of thickness of said bottom layer.

24. The computer of claim 23, wherein the simulation further comprises generating an overlying layer over said bottom layer, said overlying layer being comprised of said plurality of pixels, each pixel having a second thickness overlying said first thickness and a second index of refraction associated with said overlying layer.

25. The computer of claim 22, wherein the simulation further comprises finding the optimal thickness of a first layer of said alignment mark, wherein said finding the optimal thickness comprises:

generating at least one additional model of said alignment mark, wherein the thickness of said first layer is varied within a first range for each at least one additional model;

generating the complex reflectivity for each pixel within each at least one additional model;

generating the signal strength for each at least one additional model; and comparing the peak signal strengths for all of the models, wherein the highest signal strength is provided by the optimal thickness of said first layer.

26. The computer of claim 25, wherein the simulation further comprises finding the optimal thickness of said first layer and of a second layer of said alignment mark, wherein said finding the optimal thickness comprises:

generating said at least one additional model of said alignment mark, wherein the thickness of said first layer is varied within a first range for each at least one additional model and the thickness of said second layer is set at a first value;

generating additional models of said alignment mark after said generating the signal strength, wherein the thickness of said first layer is varied within a first range for each additional model and the thickness of said second layer is independently varied within a second range for each additional model;

generating the complex reflectivity for each pixel within each additional model; and generating the signal strength for each additional model until a signal strength has been generated for the entire range of thicknesses for both said first layer and said second layer.

27. The computer of claim 25, wherein the simulation further comprises finding the optimal thickness of a second layer, wherein said finding the optimal thickness of said second layer comprises:

generating multiple optimized models of said alignment mark, each of said multiple optimized models having said optimal thickness of said first layer and having a different thickness of said second layer within a second range;

generating the complex reflectivity for each pixel within each of said multiple optimized models;

generating the signal strength for each of said multiple optimized models; and comparing the peak signal strengths for all the multiple optimized models, wherein the highest signal strength is provided by the optimal thickness of said second layer.

28. The computer of claim 27, wherein the simulation further comprises:

generating multiple re-optimized models of said alignment mark, each of said multiple re-optimized models having said optimal thickness of said second layer and having a different thickness of said first layer within a third range, wherein said third range is less than said first range;

generating the complex reflectivity for each pixel within each of said multiple re-optimized models;

generating the signal strength for each of said multiple re-optimized models;

comparing the peak signal strengths for all the multiple re-optimized models, wherein the highest signal strength is provided by the second optimal thickness of said first layer;

generating a second group of multiple re-optimized model models of said alignment mark, each of said second group of multiple re-optimized models having said second optimal thickness of said first layer and having a different thickness of said second layer within a fourth range, wherein said fourth range is less than said second range;

generating the complex reflectivity for each pixel within each of said second group of multiple re-optimized models;

generating the signal strength for each of said second group of multiple re-optimized models;

comparing the peak signal strengths for all the second group of multiple re-optimized models, wherein the highest signal strength is provided by the second optimal thickness of said second layer;

comparing the highest signal strength of said second group of multiple re-optimized models with said highest signal strength for the multiple optimized models; and iteratively repeating the process until the change between highest signal strengths of subsequent optimized modes is below a threshold.

29. An alignment simulator for simulating the diffracted signals from an alignment mark, said alignment simulator comprising:

an operating input unit for receiving alignment mark parameters;

an alignment processor unit for:

modeling a cross section of an alignment mark based on said alignment mark parameters, said alignment mark having at least one layer, said model comprised of a plurality of pixels, wherein each pixel defines a thickness and a complex index of refraction of said at least one layer as an alignment mark parameter received from said operating input unit generating a diffraction intensity of said alignment mark using scalar diffraction, wherein said scalar diffraction includes generating the complex index reflectivity for each pixel and performing a fast fourier transform on the complex reflectivity for said plurality of pixels; and modeling a series of cross sections of said alignment mark, each of said series of cross sections representing a cross section at a different location of said alignment mark, wherein each of said series of cross sections is comprised of a series of pixels;

wherein said alignment processor unit is coupled to said operating input unit; and a display unit coupled to said alignment processor unit, said display unit for displaying the results of the simulation of signals from said alignment mark.

30. The alignment simulator of claim 29, wherein said alignment processor unit generates an alignment signal waveform displayed on said display unit, wherein said waveform is a sine wave with an amplitude equal to one half of the diffraction intensity and the phase of said sine wave is the difference in the phase angles of the fast fourier transform result according to the following:

+1/−1phase=ϕfft(+1)−ϕfft(−1)

0/+2phase=ϕfft(0)−ϕfft(+2)

0/−2phase=ϕfft(0)−ϕfft(−2)

where +1/−1 phase represents the different difference in phase between the +1 and −1 order, 0/+2phase represents the difference in phase between the 0 and +2 order, 0/−2phase represents the difference in phase between the 0 and −2 order, and ϕfft(+1), fft(−1), ϕfft(0), ϕfft(+2), ϕfft(−2) represent the phase angles of the respective +1, −1, 0, +2, and −2 order results of the fast fourier transform.

31. The alignment simulator of claim 29, wherein said alignment processor unit generates the image of said alignment mark on said display unit, said alignment processor unit generating said image by:

removing the orders from the fast fourier transform result that are not collected by an aperture of a collector in the alignment system being simulated;

performing an inverse fast fourier transform on the remaining orders from the fast fourier transform result generating an image of said alignment mark for one wavelength at one illumination angle;

repeating the process for a range of illumination angles based on the aperture size of the lens generating images of said alignment mark for one wavelength at multiple illumination angles;

repeating the process for a range of wavelengths generating images of said alignment mark for multiple wavelengths at multiple illumination angles; and averaging the results of said images of said alignment mark for multiple wavelengths at multiple illumination angles.

32. The alignment simulator of claim 29, wherein said alignment processor unit generates an alignment signal waveform on said display unit, said alignment processor unit further generating said alignment signal waveform by:

generating the total diffracted energy for said each of said series of cross sections using scalar diffraction, wherein said scalar diffraction includes generating the complex reflectivity for each pixel, performing a fast fourier transform on the complex reflectivity for said series of pixels, generating the intensity of the resulting orders of said fast fourier transform by multiplying said resulting orders by their complex conjugates and summing said intensity of the resulting orders resulting in the total diffracted energy for said each of said series of cross sections; and convoluting each total diffracted energy by the gaussian profile of the illumination beam.

33. The alignment simulator of claim 32, wherein said gaussian profile of the illumination beam is the following:

$$\text{profile}(x) = e^{-2(\frac{x}{1.5})^2}$$

where profile(x) is the profile of the beam along the scanning direction of the beam.

34. The alignment simulator of claim 29, wherein said alignment processor unit is a microprocessor.

35. An exposure method to transcribe a pattern onto a substrate used in integrated circuit manufacturing, comprising steps of:

determining a structure of the substrate by simulation, said structure comprising at least one of a material of a layer placed on the substrate, a thickness of the layer placed on the substrate, a size of a mark formed on the substrate and a shape of a mark formed on the substrate; and exposing the pattern onto the substrate which has the determined structure, wherein the determining the structure of the substrate further comprises:

generating a cross sectional model of an alignment mark having one or more layers, said model comprised of a plurality of pixels, wherein each pixel has a thickness and an index of refraction associated with each layer within said pixel;

generating a complex reflectivity for each pixel within said model; and generating a signal strength for said model by generating a diffraction intensity for said model by performing a fast fourier transform on said plurality of pixels of said model and multiplying at least two orders of the fast fourier transform results by their respective complex conjugates and summing the results together.

36. A medium storing a program and including computer-executable instructions that, when executed by a computer, perform a process for generating a signal strength for a cross sectional model of an alignment mark used in integrated circuit manufacturing, comprising:

generating a cross sectional model of an alignment mark having one or more layers, said model comprised of a plurality of pixels, wherein each pixel has a thickness and an index of refraction associated with each layer within said pixel;

generating a complex reflectivity for each pixel within said model; and generating a signal strength for said model by generating a diffraction intensity for said model by performing a fast fourier transform on said plurality of pixels of said model and multiplying at least two orders of the fast fourier transform results by their respective complex conjugates and summing the results together.

37. The medium of claim 36, wherein the medium is capable of being inserted into a computer used for simulation and removed from the computer.

38. The medium of claim 36, wherein the medium includes at least one of an electrically alterable medium and a magnetically alterable medium.

39. A method of making an exposure apparatus that transcribes a pattern onto a substrate used in integrated circuit manufacturing, comprising the steps of:

providing a simulator which determines a structure of the substrate, said structure comprising at least one of a material of a layer placed on the substrate, a thickness of the layer placed on the substrate, a size of a mark formed on the substrate, and a shape of the mark formed on the substrate; and providing an exposing unit which exposes the pattern onto the substrate that has the structure determined by the simulator, wherein the step of providing the simulator comprises:

providing a first unit which generates a cross sectional model of an alignment mark having one or more layers, said model comprised of a plurality of pixels, wherein each pixel has a thickness and are index of refraction associated with each layer within said pixel;

providing a second unit which is electrically connected to said first unit, and which generates a complex reflectivity for each pixel within said model; and providing a third unit which is electrically connected to the second unit, and which generates a signal strength for said model by generating a diffraction intensity for said model by performing a fast fourier transform on said plurality of pixels of said model and multiplying at least two orders of the fast fourier transform results by their respective complex conjugates and summing the results together.

40. A method for manufacturing a micro device by transcribing a pattern onto a substrate comprising steps of:

determining a structure of the substrate by simulation, said structure comprising at least one of a material of a layer placed on the substrate, a thickness of the layer placed on the substrate, a size of a mark formed on the substrate, and a shape of the mark formed on the substrate;

placing the substrate that has the determined structure on an exposure apparatus; and exposing the pattern onto the substrate placed on the exposure apparatus, wherein the determining the structure of the substrate further comprises:

generating a cross sectional model of an alignment mark having one or more layers, said model comprised of a plurality of pixels, wherein each pixel has a thickness and an index of refraction associated with each layer within said pixel;

generating a complex reflectivity for each pixel within said model; and generating a signal strength for said model by generating a diffraction intensity for said model by performing a fast fourier transform on said plurality of pixels of said model and multiplying at least two orders of the fast fourier transform results by their respective complex conjugates and summing the results together.

41. An exposure apparatus which transcribes a pattern onto a substrate comprising:

a simulator which determines a structure of the substrate, said structure comprising at least one of a material of a layer placed on the substrate, a thickness of the layer placed on the substrate, a size of a mark formed on the substrate, and a shape of the mark formed on the substrate; and an exposing unit which exposes the pattern onto the substrate having the structure determined by the simulator, wherein the simulator comprises:

a first unit which generates a cross sectional model of an alignment mark having one or more layers, said model comprised of a plurality of pixels, wherein each pixel has a thickness and an index of refraction associated with each layer within said pixel;

a second unit which is electrically connected to said first unit, and which generates a complex reflectivity for each pixel within said model; and a third unit which is electrically connected to the second unit, and which generates a signal strength for said model by generating a diffraction intensity for said model by performing a fast fourier transform on said plurality of pixels of said model and multiplying at least two orders of the fast fourier transform results by their respective complex conjugates and summing the results together.

* * * * *

UNITED STATES PATENT AND TRADEMARK OFFICE
CERTIFICATE OF CORRECTION

PATENT NO. : 6,988,060 B1
DATED : January 17, 2006
INVENTOR(S) : Paul Derek Coon et al.

It is certified that error appears in the above-identified patent and that said Letters Patent is hereby corrected as shown below:

<u>Title page,</u>
Item [57], ABSTRACT,
Line 14, "layers indices" should read -- layers' indices --.

<u>Column 20,</u>
Line 44, "layers" should read -- layer, --.

<u>Column 21,</u>
Line 66, "fft(O)" should read -- fft(0) --.

<u>Column 22,</u>
Line 31, "-9.20" should read -- -9.2° --.
Line 32, "+13.80 to -13.80." should read -- +13.8° to -13.8°. --.

<u>Column 23,</u>
Line 37, "model" should read -- models --.

<u>Column 26,</u>
Line 54, delete "model".

<u>Column 27,</u>
Line 23, "unit" should read -- unit; --.
Line 53, delete "different".
Line 57, "fft(-1)," should read -- ø fft(-1), --.

UNITED STATES PATENT AND TRADEMARK OFFICE
CERTIFICATE OF CORRECTION

PATENT NO. : 6,988,060 B1
DATED : January 17, 2006
INVENTOR(S) : Paul Derek Coon et al.

It is certified that error appears in the above-identified patent and that said Letters Patent is hereby corrected as shown below:

<u>Column 29,</u>
Line 43, "are" should read -- an --.

Signed and Sealed this

Second Day of May, 2006

JON W. DUDAS
*Director of the United States Patent and Trademark Office*